United States Patent [19]

Scepanovic et al.

[11] Patent Number: 5,808,899

[45] Date of Patent: Sep. 15, 1998

[54] ADVANCED MODULAR CELL PLACEMENT SYSTEM WITH CELL PLACEMENT CRYSTALLIZATION

[75] Inventors: Ranko Scepanovic; James S. Koford, both of San Jose, Calif.; Alexander E. Andreev, Moskovskaga Oblast, Russian Federation

[73] Assignee: LSI Logic Corporation, Milpitas, Calif.

[21] Appl. No.: 672,235

[22] Filed: Jun. 28, 1996

[51] Int. Cl.$^6$ ..................................................... G06F 17/50
[52] U.S. Cl. ........................................... 364/491; 364/488
[58] Field of Search .................................... 364/488, 489, 364/490, 491, 578

[56] References Cited

U.S. PATENT DOCUMENTS

| 3,603,771 | 9/1971 | Isett | 364/491 |
| 3,617,714 | 11/1971 | Kernighan | 364/491 |
| 4,306,286 | 12/1981 | Cocke et al. | 364/200 |

(List continued on next page.)

OTHER PUBLICATIONS

Murty, *Network Programming*, Prentice–Hall, 1992, pp. 168–187.
Technical summary, Kendall Square Research, 1992, pp. 1–82.
Shahookar et al., "VLSI Cell Placement Techniques", ACM Computing Surveys, vol. 23, No. 2, Jun. 1991. No Page #.
Equation of State Calculations by Fast Computing Machines, N. Metropolis, A.W. Rosenbluth, M.N. Rosenbluth, A.H. Teller, The Journal of Chemical Physics, vol. 21, No. 6, Jun. 1953. No Page #s.
Stochastic Evolution: A Fast Effective Heuristic for Some Generic Layout Problems, Y.G. Saab, V.B. Rao, 27th ACM/IEEE Design Automation Conference, 1990, Paper 2.2. No Page #s.
Linear Network Optimization: Alogorithms, and Codes, D.P. Bertsekas, 1991. No Page #s.
Toward Efficient Hierarchical Designs by Ratio Cut Partitioning, Y. Wei and C. Cheng, 1989, IEEE. No Page #s.
Pad Placement and Ring Routing for Custom Chip Layout, D. Wang, 27th ACM/IEEE Design Automation Conference, Paper 10.3. No Page #s.
Pin Assignment with Global Routing, J. (Jason) Cong, 1989 IEEE. No Page #s.
An Efficient Heuristic Procedure for Partitioning Graphs, B.W. Kernighan, S. Lin. No Page #s.
Ten: The Transportation and Assignment Problems, No Author, Date, or Page #s.
Simultaneous Floor Planning and Global Routing for Hierarchical Building–Block Layout, W. Dai, E. Kuh, 1987 IEEE. No Page #s.
A New Clustering Approach and Its Application to BBL Placement, M.Y. Yu, X.L. Hong, Y.E. Lien, Z.Z. Ma, J.G. Bo, W.J. Zhuang, 1990 IEEE. No Page #s.
Genetic Placement, J. P. Cohoon, W. D. Paris, 1986 IEEE. No Page #s.
Champ: Chip Floor Plan for Hierarchial VLSI Layout Design, K. Ueda, H. Kitazawa, and I. Harada, IEEE Transactions on Computer–Aided Design, vol. CAD–4, No. 1, Jan. 1985. No Page #s.

(List continued on next page.)

*Primary Examiner*—Kevin J. Teska
*Assistant Examiner*—Leigh Marie Garbowski
*Attorney, Agent, or Firm*—Mitchell, Silberberg & Knupp LLP

[57] ABSTRACT

A system for optimizing placement of a plurality of cells located on a surface of a semiconductor chip divided into regions by grid lines is disclosed herein. The system first increases the size associated with each cell by a fixed amount. The system then performs various density equalization routines to all cells, and locates cells having a size greater than a predetermined quantity and fixes those cells. Finally, the system executes a plurality of optimal cell movement routines to crystallize cell placement.

31 Claims, 20 Drawing Sheets

U.S. PATENT DOCUMENTS

| | | | |
|---|---|---|---|
| 4,342,090 | 7/1982 | Caccoma et al. | 364/491 |
| 4,484,292 | 11/1984 | Hong et al. | 364/490 |
| 4,495,559 | 1/1985 | Gelatt, Jr. et al. | 364/148 |
| 4,554,625 | 11/1985 | Otten | 364/148 |
| 4,577,276 | 3/1986 | Dunlop et al. | 364/491 |
| 4,593,363 | 6/1986 | Burstein et al. | 364/491 |
| 4,612,618 | 9/1986 | Pryor et al. | 364/490 |
| 4,615,011 | 9/1986 | Linsker | 364/491 |
| 4,621,339 | 11/1986 | Wagner et al. | 364/900 |
| 4,630,219 | 12/1986 | Digiacomo et al. | 364/489 |
| 4,656,580 | 4/1987 | Hitchcock, Sr. et al. | 364/200 |
| 4,675,829 | 6/1987 | Clemenson | 364/513 |
| 4,686,629 | 8/1987 | Noto et al. | 364/491 |
| 4,688,072 | 8/1987 | Heath et al. | 364/490 |
| 4,697,242 | 9/1987 | Holland et al. | 364/513 |
| 4,754,408 | 6/1988 | Carpenter et al. | 364/491 |
| 4,763,288 | 8/1988 | Deering et al. | 364/578 |
| 4,815,003 | 3/1989 | Putatunda et al. | 364/491 |
| 4,829,446 | 5/1989 | Draney | 364/491 |
| 4,831,725 | 5/1989 | Dunham et al. | 29/847 |
| 4,850,027 | 7/1989 | Kimmel | 382/49 |
| 4,872,125 | 10/1989 | Catlin | 364/578 |
| 4,908,772 | 3/1990 | Chi | 364/491 |
| 4,910,680 | 3/1990 | Hiwatashi | 364/491 |
| 4,918,614 | 4/1990 | Modarres et al. | 364/490 |
| 4,961,152 | 10/1990 | Davis | 364/513 |
| 4,965,739 | 10/1990 | Ng | 364/491 |
| 5,051,895 | 9/1991 | Rogers | 364/200 |
| 5,051,938 | 9/1991 | Hyduke | 364/578 |
| 5,062,054 | 10/1991 | Kawakami et al. | 364/491 |
| 5,119,313 | 6/1992 | Shaw et al. | 364/491 |
| 5,124,927 | 6/1992 | Hopewell et al. | 364/468 |
| 5,136,686 | 8/1992 | Koza | 395/13 |
| 5,140,402 | 8/1992 | Murakata | 357/45 |
| 5,140,526 | 8/1992 | Mc Dermith et al. | 364/488 |
| 5,140,530 | 8/1992 | Guha et al. | 395/13 |
| 5,144,563 | 9/1992 | Date et al. | 364/491 |
| 5,157,778 | 10/1992 | Bischoff et al. | 395/500 |
| 5,159,682 | 10/1992 | Toyonaga et al. | 395/500 |
| 5,187,668 | 2/1993 | Okude et al. | 364/468 |
| 5,191,542 | 3/1993 | Murofushi | 364/491 |
| 5,200,908 | 4/1993 | Date et al. | 364/491 |
| 5,202,840 | 4/1993 | Wong | 364/490 |
| 5,208,759 | 5/1993 | Wong | 364/468 |
| 5,218,551 | 6/1993 | Agrawal et al. | 364/491 |
| 5,222,029 | 6/1993 | Hooper et al. | 364/489 |
| 5,222,031 | 6/1993 | Kaida | 364/489 |
| 5,224,056 | 6/1993 | Chene et al. | 364/490 |
| 5,224,057 | 6/1993 | Igarashi et al. | 364/490 |
| 5,225,991 | 7/1993 | Dougherty | 364/491 |
| 5,231,590 | 7/1993 | Kumar et al. | 364/491 |
| 5,239,465 | 8/1993 | Hattori et al. | 364/419.19 |
| 5,245,550 | 9/1993 | Miki et al. | 364/490 |
| 5,249,259 | 9/1993 | Harvey | 395/13 |
| 5,251,147 | 10/1993 | Finnerty | 364/490 |
| 5,255,345 | 10/1993 | Shaefer | 395/13 |
| 5,267,176 | 11/1993 | Antreich et al. | 364/491 |
| 5,267,177 | 11/1993 | Sato et al. | 364/491 |
| 5,303,161 | 4/1994 | Burns et al. | 364/490 |
| 5,309,371 | 5/1994 | Shikata et al. | 364/489 |
| 5,341,308 | 8/1994 | Mendel | 364/488 |
| 5,349,536 | 9/1994 | Ashtaputre et al. | 364/491 |
| 5,363,313 | 11/1994 | Lee | 364/489 |
| 5,392,222 | 2/1995 | Noble | 364/490 |
| 5,398,195 | 3/1995 | Kim | 364/491 |
| 5,404,313 | 4/1995 | Shiohara et al. | 364/491 |
| 5,404,561 | 4/1995 | Castelaz | 364/490 |
| 5,465,218 | 11/1995 | Handa | 364/489 |
| 5,495,419 | 2/1996 | Rostoker et al. | 364/468 |
| 5,521,837 | 5/1996 | Frankle et al. | 364/491 |
| 5,557,533 | 9/1996 | Koford et al. | 364/491 |

OTHER PUBLICATIONS

Pin Assignment with Global Routing for General Cell Designs, Jingsheng (Jason) Cong, IEEE Transaction on Computer–Aided Design, vol. 10, No. 11, Nov. 1991. No Page #s.

Floorplanning with Pin Assignment, Massoud Pedram, Malgorzata Marek–Sadowska, Ernest K. Kuh, 1990 IEEE. No Page #s.

A New Approach to the Pin Assignment Problem, Xianjin Yao, Massaki Yamada, C.L. Lis, 25th ACM/IEEE Design Automation Conference, 1988, Paper 37.3. No Page #s.

A Forced Directed Component Placement Procedure for Printed Circuit Boards, N. Quinn, Jr., and M. Breuer; IEEE Transactions on Circuits and Systems, vol. CAS–26, No. 6, Jun. 1979. No Page #s.

Simultaneous Pin Assignment and Global Wiring for Custom VLSI Design, L.Y. Wang, Y.T. Lai, and B.D. Liu, IEEE, 1991. No Page #s.

An Improved Simulated Annealing Algorithm for Row–Based Placement, C. Sechen and K. Lee; IEEE Int'l Conf. on Computer–Aided Design, Nov. 1987, pp. 478–481.

A Linear–Time Heuristic for Improving Network Partitions, C.M. Fiduccia and R.M. Mattheyses; IEEE 1982, 19th Design Automation Conference, Paper 13.1, pp. 175–181.

A Block Placement Procedure Using a Force Model, H. Onodera and K. Tamaru; Electronics and Communications in Japan, Part 3, vol. 72, No. 11, 1989, pp. 87–96.

Wolverines: Standard Cell Placement on a Network of Workstations, S. Mohan and P. Mazumder, vol. 12, No. 9, Sep. 1993. No Page #s.

The Stanford Dash Multiprocessor, D. Lenoski et al.; Computer, Mar. 1992. No Page #s.

Genetic Programming, J. Koza; MIT Press, Cambridge, MA, 1993, pp. 94–101 and 173.

Algorithms for VLSI Physical Design Automation, N. Sherwani, Kluwer Academic Publishers, 1993, No Page #s.

Timber Wolf 3.2:A New Standard Cell Placement and Global Routing Package, C. Sechen and A. Sangiovanni–Vincentelli; IEEE 23rd Design Automation Conf., 1986, Paper 26.1, No Page #s.

A Genetic Approach to Standard Cell Placement using Metagenetic Parameter Optimization, K. Shahookar and P. Mazumder; IEEE Transactions on Computer–Aided Design, vol. 9, No. 5, May 1990. Page #s Omitted.

The S3.MP Interconnect System & TIC Chip, A. Nowatzyk and M. Parkin; Proceedings of IEEE Computer Society HOT Interconnect Symposium, Stanford Univ., 1993. No Page #s.

Gordian: VLSI Placement by Quadratic Programming and Slicing Optimization, J. Kleinhans, G. Sigl, F. Johannes, and K. Antreich; IEEE Transactions on Computer–Aided Design, vol. 10, No. 3, Mar. 1991. No Page #s.

A Loosely Coupled Parallel Algorithm for Standard Cell Placement, W. Sun. and C. Sechen; ACM, 1994, pp. 137–144.

Placement of Standard Cells Using Simulated Annealing on the Connection Machine, Andrea Casotto, Alberto Sangiovanni–Vincentelli, 1987 IEEE. No Page #s.

Parallel Standard Cell Placement Algorithms with Quality Equivalent to Simulated Annealing, Jonathan S. Rose, W. Martin Snelgrove, Zvonko G. Vranesic, IEEE Transactiona on Computer–Aided Design, vol. 7, No. 3, Mar. 1988. No Page #s.

Performance of a Parallel Algorithm for Standard Cell Placement on the Intel Hypercube, Mark Jones, Prithviraj Baner Jee, 24th ACM/IEEE Design Automation Conference, p. 42.3, 1987. No Page #s.

A Parallel Simulated Annealing Algorithm for the Placement of Macro–Cells, Andrea Casotto, Fabio Romeo and Alberto Sandiovanni–Vincentelli. no date or page #.

Properplace: A Portable Parallel Algoritham for Standard Cell Placement, Sungho Kim, John A. Chandy, Steven Parkes, Balkrishna Ramkumar, Prithviraj Banerjee, 1994 IEEE. no page #.

A Cell–Replicating Approach to Mincut–Based Circuit Partitioning, Chuck Kring and A. Richard Newton, 1991 IEEE. no page #.

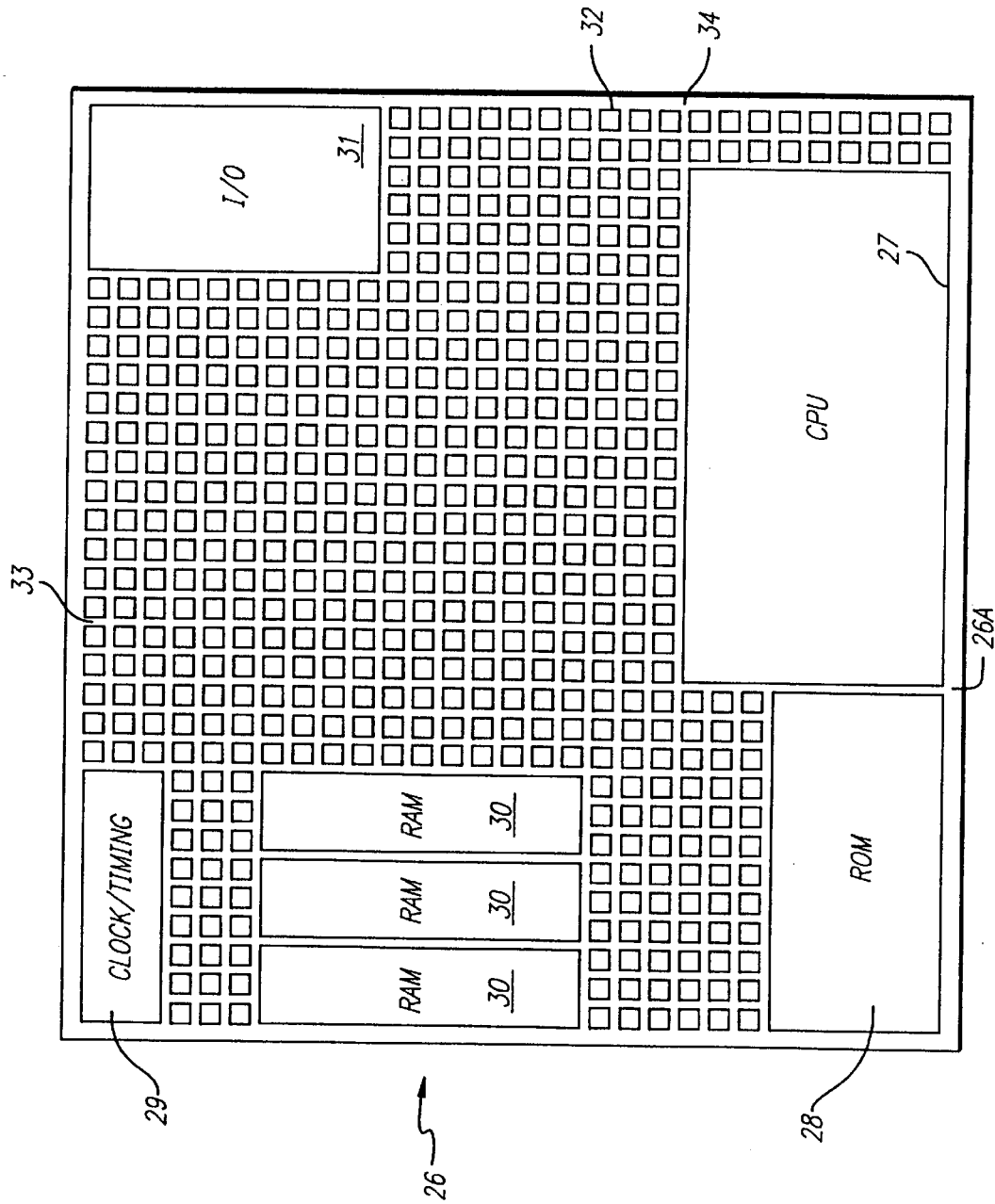

FIG. 17
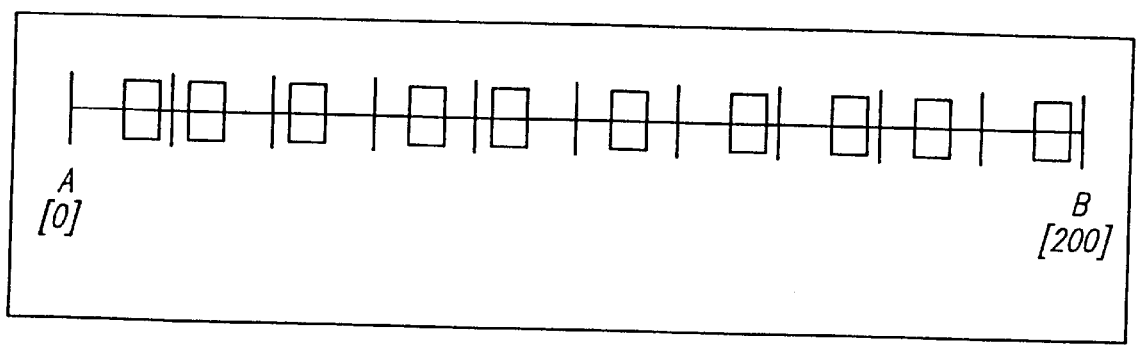
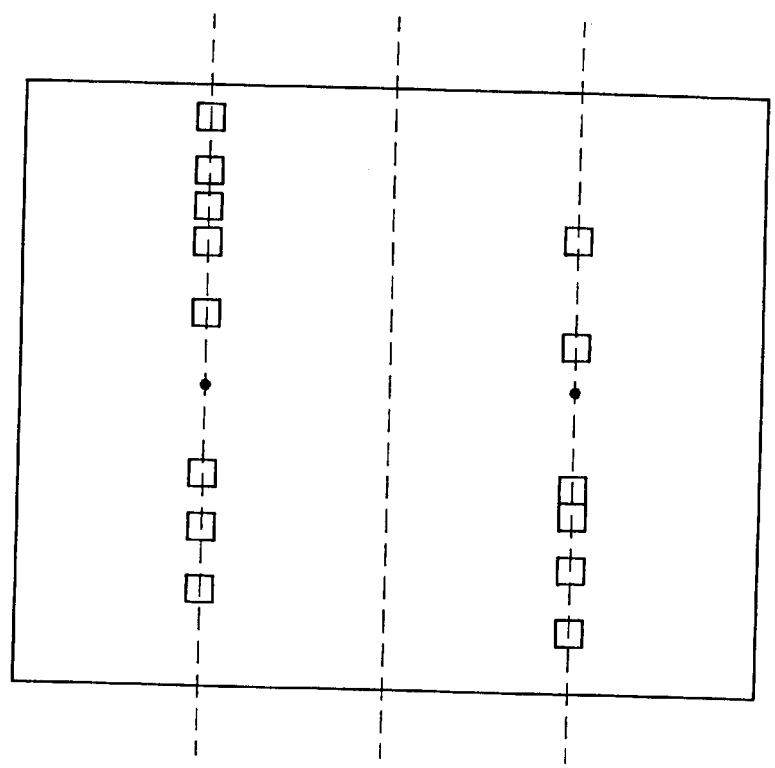
FIG. 20

ADVANCED MODULAR CELL PLACEMENT SYSTEM WITH CELL PLACEMENT CRYSTALLIZATION

BACKGROUND OF THE INVENTION

1. Field of the Invention

The present invention generally relates to the art of microelectronic integrated circuits, and more specifically to a system for placement of cells on integrated circuit chips.

2. Description of the Related Art

Microelectronic integrated circuits consist of a large number of electronic components which are fabricated by layering several different materials on a silicon base or wafer. The design of an integrated circuit transforms a circuit description into a geometric description which is known as a layout. A layout consists of a set of planar geometric shapes in the various layers of the silicon chip.

The process of converting the specifications of an electrical circuit into a layout is called the physical design. Physical design requires arranging elements, wires, and predefined cells on a fixed area, and the process can be tedious, time consuming, and prone to many errors due to tight tolerance requirements and the minuteness of the individual components.

Currently, the minimum geometric feature size of a component is on the order of 0.5 microns. Feature size may be reduced to 0.1 micron within several years. This small feature size allows fabrication of as many as 10 million transistors or 1 million gates of logic on a 25 millimeter by 25 millimeter chip. This feature size decrease/transistor increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The object of physical chip design is to determine an optimal arrangement of devices in a plane and to find an efficient interconnection or routing scheme between the devices to obtain the desired functionality. Since space on the chip surface is at a premium, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including genetic algorithms such as simulated evolution, force directed placement or simulated annealing, described hereinbelow, and comparing the resulting placements using a cost criteria.

Depending on the input, placement algorithms are classified into two major groups, constructive placement and iterative improvement methods. The input to the constructive placement algorithms consists of a set of blocks along with the netlist. The algorithm provides locations for the blocks. Iterative improvement algorithms start with an initial placement. These algorithms modify the initial placement in search of a better placement. The algorithms are applied in a recursive or an iterative manner until no further improvement is possible, or the solution is considered to be satisfactory based on a predetermined criteria.

Iterative algorithms can be divided into three general classifications: simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Interactive algorithms function by generating large numbers of possible placements and comparing them in accordance with some criteria which is generally referred to as fitness. The fitness of a placement can be measured in a number of different ways, for example, overall chip size. A small size is associated with a high fitness and vice versa. Another measure of fitness is the total wire length of the integrated circuit. A high total wire length indicates low fitness and vice versa.

The relative desirability of various placement configurations can alternatively be expressed in terms of cost, which can be considered as the inverse of fitness, with high cost corresponding to low fitness and vice versa.

a. Simulated Annealing

Basic simulated annealing per se is well known in the art and has been successfully used in many phases of VLSI physical design such as circuit partitioning. Simulated annealing is used in placement as an iterative improvement algorithm. Given a placement configuration, a change to that configuration is made by moving a component or interchanging locations of two components. Such interchange can be alternatively expressed as transposition or swapping.

In the case of a simple pairwise interchange algorithm, it is possible that a configuration achieved has a cost higher than that of the optimum, but no single interchange can cause further cost reduction. In such a situation, the algorithm is trapped at a local optimum and cannot proceed further. This happens quite often when the algorithm is used in practical applications. Simulated annealing helps to avoid getting achieving and maintaining a local optima by occasionally accepting moves that result in a cost increase.

In simulated annealing, all moves that result in a decrease in cost are accepted. Moves that result in an increase in cost are accepted with a probability that decreases over time as the iterations proceed. The analogy to the actual annealing process is heightened with the use of a parameter called temperature T. This parameter controls the probability of accepting moves that result in increased cost.

More of such moves are accepted at higher values of temperature than at lower values. The algorithm starts with a very high value of temperature that gradually decreases so that moves that increase cost have a progressively lower probability of being accepted. Finally, the temperature reduces to a very low value which requires that only moves that reduce costs are to be accepted. In this way, the algorithm converges to an optimal or near optimal configuration.

In each stage, the placement is shuffled randomly to get a new placement. This random shuffling could be achieved by transposing a cell to a random location, a transposition of two cells, or any other move that can change the wire length or other cost criteria. After the shuffle, the change in cost is evaluated. If there is a decrease in cost, the configuration is accepted. Otherwise, the new configuration is accepted with a probability that depends on the temperature.

The temperature is then lowered using some function which, for example, could be exponential in nature. The process is stopped when the temperature is dropped to a certain level. A number of variations and improvements on the basic simulated annealing algorithm have been developed. An example is described in an article entitled "Timberwolf 3.2 A New Standard Cell Placement and Global Routing Package" by Carl Sechen, et al., IEEE 23rd Designed Automation Conference paper 26.1, pages 432 to 439.

b. Simulated Evolution

Simulated evolution, which is also known as the genetic algorithm, is analogous to the natural process of mutation of species as they evolve to better adapt to their environment. The algorithm starts with an initial set of placement configurations which is called the population. The initial placement can be generated randomly. The individuals in the population represent a feasible placement to the optimization problem and are actually represented by a string of symbols.

The symbols used in the solution string are called genes. A solution string made up of genes is called a chromosome. A schema is a set of genes that make up a partial solution. The simulated evolution or genetic algorithm is iterated, and each iteration is called a generation. During each iteration, the individual placements of the population are evaluated on the basis of fitness or cost. Two individual placements among the population are selected as parents, with probabilities based on their fitness. A better fitness for an individual placement increases the probability that the placement will be chosen.

The genetic operators are called crossover, mutation and inversion, which are analogous to their counterparts in the evolution process, are applied to the parents to combine genes from each parent to generate a new individual called the offspring or child. The offspring are evaluated, and a new generation is formed by including some of the parents and the offspring on the basis of their fitness in a manner such that the size of the population remains the same. As the tendency is to select high fitness individuals to generate offspring, and the weak individuals are deleted, the next generation tends to have individuals that have good fitness.

The fitness of the entire population improves with successive generations. Consequently, overall placement quality improves over iterations. At the same time, some low fitness individual cell placements are reproduced from previous generations to maintain diversity even though the probability of doing so is quite low. In this way, it is assured that the algorithm does not lock into a local optimum.

The first main operator of the genetic algorithm is crossover, which generates offspring by combining schemata of two individuals at a time. Combining schemata entails choosing a random cut point and generating the offspring by combining the left segment of one parent with the right segment of the other. However, after doing so, some cells may be duplicated while other cells are deleted. This problem will be described in detail below.

The amount of crossover is controlled by the crossover rate, which is defined as the ratio of the number of offspring produced by crossing in each generation to the population size. Crossover attempts to create offspring with fitness higher than either parent by combining the best genes from each.

Mutation creates incremental random changes. The most commonly used mutation is pairwise interchange or transposition. This is the process by which new genes that did not exist in the original generation, or have been lost, can be generated.

The mutation rate is defined as the ratio of the number of offspring produced by mutation in each generation to the population size. It must be carefully chosen because while it can introduce more useful genes, most mutations are harmful and reduce fitness. The primary application of mutation is to pull the algorithm out of local optima.

Inversion is an operator that changes the representation of a placement without actually changing the placement itself so that an offspring is more likely to inherit certain schema from one parent.

After the offspring are generated, individual placements for the next generation are chosen based on some criteria. Numerous selection criteria are available, such as total chip size and wire length as described above. In competitive selection, all the parents and offspring compete with each other, and the fittest placements are selected so that the population remains constant. In random selection, the placements for the next generation are randomly selected so that the population remains constant.

The latter criteria is often advantageous considering the fact that by selecting the fittest individuals, the population converges to individuals that share the same genes and the search may not converge to an optimum. However, if the individuals are chosen randomly there is no way to gain improvement from an older generation to a new generation. By combining both methods, stochastic selection chooses probabilities based on the fitness of each individual.

c. Force Directed Placement

Force directed placement exploits the similarity between the placement problem and the classical mechanics problem of a system of bodies attached to springs. In this method, the blocks connected to each other by nets are supposed to exert attractive forces on each other. The magnitude of this force is directly proportional to the distance between the blocks. Additional proportionality is achieved by connecting more "springs" between blocks that "talk" to each other more (volume, frequency, etc.) and fewer "springs" where less extensive communication occurs between each block.

According to Hooke's Law, the force exerted due to the stretching of the springs is proportional to the distance between the bodies connected to the spring. If the bodies are allowed to move freely, they would move in the direction of the force until the system achieved equilibrium. The same idea is used for placing the cells. The final configuration of the placement of cells is the one in which the system achieves a solution that is closest to actual equilibrium.

The problem of cell placement is compounded by external requirements specific to each individual integrated circuit chip. In conventional chip design, the positions of certain "unmovable" cells (external interconnect terminals or pads, large "megacells" etc.) are fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller subcircuits until each subcircuit is small enough to be designed efficiently. Because the quality of the design may suffer due to the partitioning, the partitioning of a circuit requires care and precision.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved.

Numerous alternate methodologies for cell placement and assignment are known in the art. These include quadratic optimization as disclosed in an article entitled "GORDIAN: VLSI Placement by Quadratic Programming and Slicing Optimization", by J. Kleinhans et al, IEEE Trans. on CAD, 1991, pp. 356–365, and simulated annealing as described in an article entitled "A Loosely Coupled Parallel Algorithm for Standard Cell Placement", by W. Sun and C. Sechan, Proceedings of IEEE/ACM IC-CAD Conference, 1994, pp. 137–144.

These prior art methods cannot simultaneously solve the partitioning problem and the problem of placing partitions on the chip, and thus the applicability of such methods to physical design automation systems for integrated circuit chip design is limited.

More specifically, prior art methods do not provide any metric for specifying distances between cells based on netlist connections. An initial placement must be performed to establish physical locations for cells and thereby distances therebetween.

Also, prior art methods fix cells in clusters at the beginning of optimization, and do not provide any means for allowing cells to move between clusters as optimization proceeds. This can create areas of high routing congestion, which cannot be readily eliminated because cell movements between clusters which could relieve the congestion are not allowed.

In summary, the problem inherent in these prior cell placement methods is that repeated iterations generally do not tend to converge to a satisfactory relatively uniform overall cell placement for large numbers of cells. The aforementioned methods can take several days to place a large number of cells, and repeating these methods with different parameters or different initial arrangements may not necessarily provide improvements to cell placement. Typical methods for using these designs involve using a chosen method until a particular parameter, for example wire length, achieves a certain criteria or the method fails to achieve this criteria for a predetermined number of runs. The results are inherently non-optimal for other placement fitness measurements, having optimized the method based only on a single parameter. Further, results of these placement techniques frequently cannot be wired properly, or alternately, the design does not meet timing requirements. For example, with respect to simulated annealing, setting the temperature to different values may, under certain circumstances, improve placement, but efficient and uniform placement of the cells is not guaranteed.

SUMMARY OF THE INVENTION

According to the present invention, there is herein provided a system for optimizing placement of a plurality of cells located on the surface of a semiconductor chip. The surface is divided by grid lines into regions. The system comprises first increasing a parameter associated with each cell, such as height, by one unit plus a first predetermined percentage of the remaining available space on the surface. Secondly, the system performs various density balancing routines for a predetermined number of times and increases the parameter associated with each cell by one unit plus a second predetermined percentage of the remaining available space. The system then performs a density levelizing procedure, secures cells having size greater than a predetermined amount, executes a predetermined number of sinusoidal optimizations, and iteratively executes a series of (1) a directional optimization routine, (2) an overlap removal routine with minimal noise, and (3) a series of an optimal permutation routine; and setting elements by increasing the position of the cells until each cell reaches the closest grid line.

The various density balancing routines comprise a dispersion driven levelizing procedure and a sinusoidal optimization procedure. The directional optimization routine comprises evaluating relative cost functions for moving the cell a series of predetermined distances and selecting the movement which provides a greatest improvement in the cost function. The series of predetermined distances comprise no movement, movement in a positive direction for a predetermined distance, and movement in a negative direction a predetermined distance. Optimal permutations comprise switching adjacent elements to improve the cost function, and switching cells maintains the spacing between the two cells.

Other objects, features, and advantages of the present invention will become more apparent from a consideration of the following detailed description and from the accompanying drawings.

BRIEF DESCRIPTION OF THE DRAWINGS

FIG. 2 is an illustration of an exemplary integrated circuit chip;

FIG. 17 is an illustration of one cell located in each of the ten subintervals;

FIG. 20 is an illustration of the two regions that are divided using two dividing lines;

DESCRIPTION OF THE PREFERRED EMBODIMENTS

An overall block diagram of the preferred implementation of the current invention is presented in FIG. 1. As will become apparent from the following detailed description, other embodiments can be implemented with highly effective results while still within the scope of the invention.

Section 1: System Overview

Figure 1A:
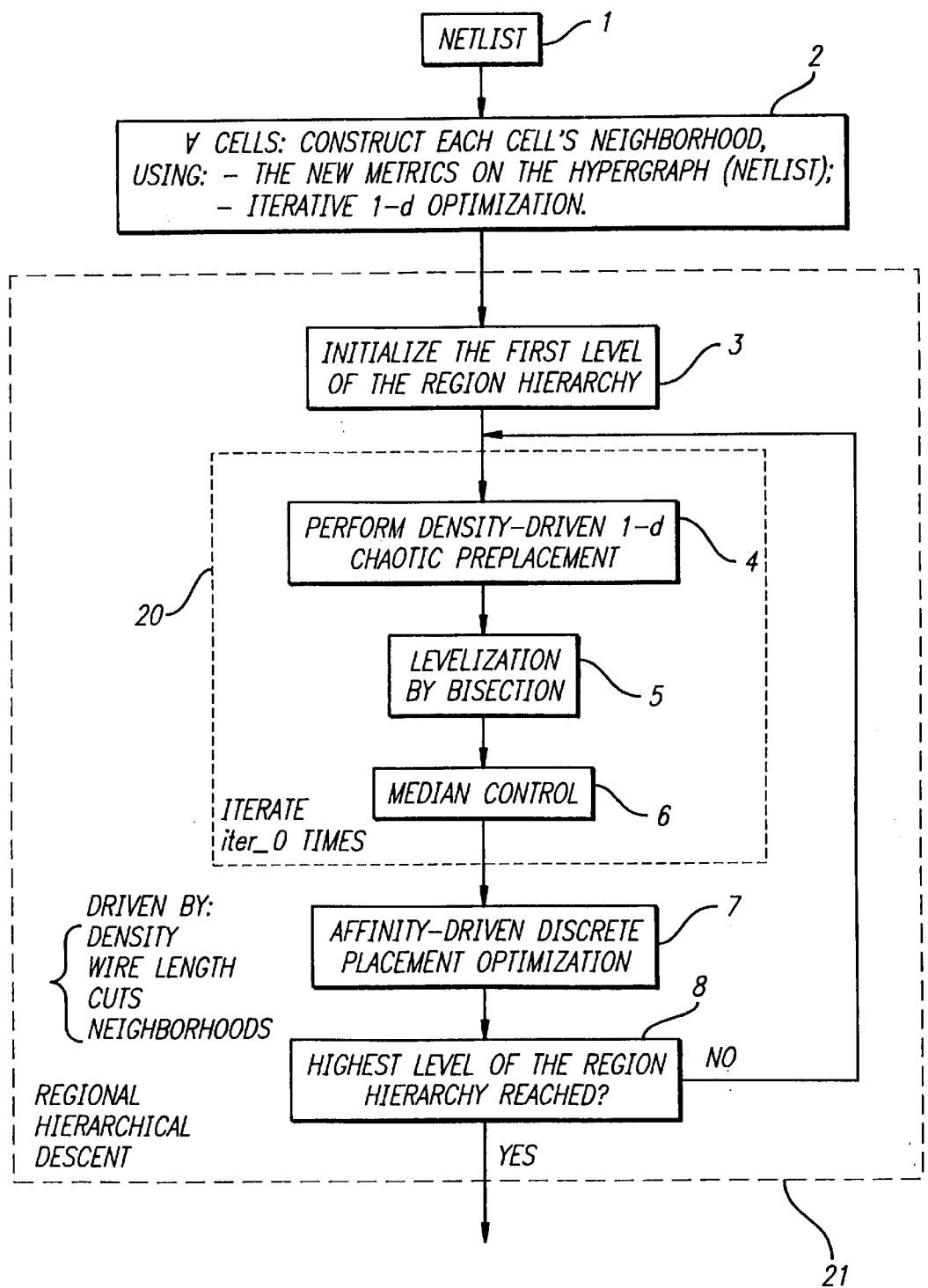
FIG. 1A is a flow chart illustrating the main steps of the process according to the present invention.
Figure 1B:
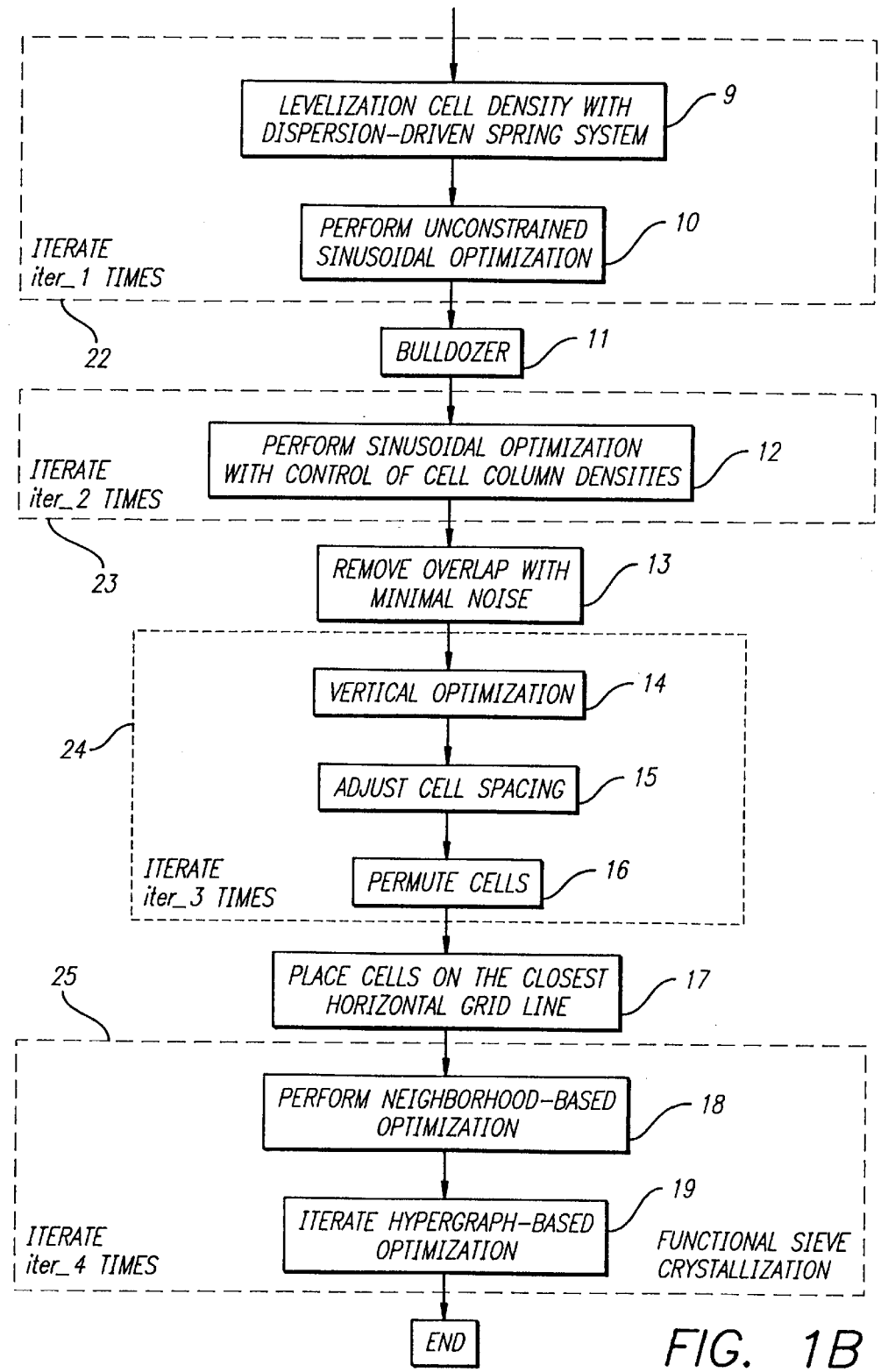
FIG. 1B is a flow chart illustrating the main steps of the process according to the present invention.

FIGS. 1A and 1B comprise a flow chart that illustrates the main steps of the process according to the present invention. A brief description of the various steps of the process is presented with reference to FIGS. 1A and 1B. To facilitate describing and understanding the invention, this disclosure is divided into sections. This first section is a general overview of the process according to the present invention. Subsequent sections describe and explain the algorithms and process steps shown in FIGS. 1A and 1B with reference to other figures of the drawings as appropriate.

The specific algorithms described herein, as well as the basic steps which they represent (even if they are replaced by different algorithms), are designed for implementation in a general purpose computer. Furthermore, each of the algorithms described herein, as well as the basic step it represents, can be encoded on computer storage media such as CD Roms, floppy disks and computer harddrives, whether alone or in combination with one or more of the algorithms and steps described herein.

Given only the netlist, before the cells have been placed on the chip, there is no way using prior art techniques to compute the conventional geometric distance between two cells (the "Euclidean distance") because no geometric coordinates exist for any cell. A new mathematical form of distance is defined in the algorithms according to the present invention in which the distance between cells can be calculated from the way in which connections in the netlist interconnect its cells. This distance measure plays a critical role in the analysis of the netlist for placement by the algorithms.

The cell placement system according to the present invention performs placement as either a uniprocessor or parallel processor procedure. Unlike previous systems in which a constructive heuristic provided an initial placement followed by a statistical improvement technique, the process according to the present invention constructs and optimizes placements in a series of highly integrated steps.

Subsection 1A: Data Preparation

The use of placement techniques must, of course, be preceded by the step 1 of preparation of the netlist. For a large chip, preparation of the netlist is a major design effort that includes system specification, synthesis, debugging, preliminary timing, and final netlist construction. The specifics of these complex design steps are not the subject of the present disclosure. The description of the present invention begins by assuming that the system to be implemented on the chip has been designed and that the resulting correct netlist is available. The techniques for preparing a netlist are well known in the art.

Subsection 1B: Neighborhood Construction

As shown at the start of the flowchart of FIG. 1A, the process according to the present invention constructs a neighborhood 2 for each cell in the netlist. Neighborhood construction is discussed in more detail in §2 below. The neighborhoods are preferably constructed according to the neighborhood construction process described below. After the neighborhood of a cell is constructed, coordinates are assigned to each cell, as described in detail subsequently in §3, which describes a preferred technique for optimization of the cell neighborhoods.

Subsection 1C: Placement Iteration

The cell coordinates are then iteratively optimized under the iterative 1D preplacement optimization procedure described in §4. The purpose of this iterative 1D preplacement optimization procedure is to get a fast, good cell preplacement. In the iterative one-dimensional preplacement optimization procedure of §4, the cells are pre-placed on a two-dimensional abstraction of the chip surface. The iterative one-dimensional preplacement optimization procedure begins with the step 3 of initializing the coordinates of all cells at the center of the surface, and then performing the iterations described in §4 in the x- and y-directions.

A density-driven one dimensional preplacement is performed 4 to assign cells to regions in accordance with the capacities of each region of the chip. A preferred process for assigning cells to regions in accordance with region capacity is described in §5.

The surface abstraction is divided into subregions by bisection in a selected direction. A preferred levelization by bisection process 5 is described in §5.

A median control procedure 6 is then used to modify coordinates to the cells. A preferred median control process is described in §6.

The 1D preplacement optimization procedure of §4, the cut-point procedure of §5 and the median control procedure of §6 are then iterated for a specified number of times, and the average value of the cost function (e.g. wire length) for the iterations is computed. The 1D preplacement optimization procedure of §4, the cut-point procedure of §5 and the median control procedure of §6 are then again iterated for the specified number of times as a block 20 and the average cost function is recomputed. If the average cost function is decreased by less than a specified amount, usually $10^{-3}$, this step (block 20) is exited. Otherwise this step (block 20) is again iterated with the average cost function again computed and compared to the previous average cost function value. At the end of this step the cells have been assigned to subregions in such a way that the capacities of the subregions are not exceeded.

Subsection 1D: Affinity-Driven Placement Optimization

An affinity-driven placement optimization 7 is performed to improve cell placement and to minimize the cost function. A preferred affinity-driven placement optimization process is described in §7. The affinity optimizations are driven by considerations of cost functions as described in §§8–11. Referring to §12, a functional sieve optimization technique is also used to perform the cell movement. When the affinity-driven optimization is complete, the level of the subdivision of the chip surface is checked 8. If the level of subdivision is not at the specified highest level (i.e., the level of hierarchy with the smallest desired regions), block 21 is repeated the chip is further subdivided in the y-dimension; the preplacement iteration of §4–6, is reentered with that level of subdivision for the y-coordinate. The preferred highest level is where the region is one column wide. After processing for the y-coordinate is complete, the x-coordinate is processed, etc., as x and y alternate.

The typical number of iterations of block 21 is $2\log_2 N$ where N equals the number of columns in the chip. If, for example, the chip has 8 columns, the number of iterations is $2\log_2 8$, or 6.

After a certain level of hierarchy is achieved, it may be desirable to stop the process at this point and not continue with further cell placement. This is especially true if one wants to obtain a fast estimate of cell placement.

Subsection 1E: Cell Density Levelization

Finally, when the highest level of hierarchy is reached 8, the process enters a cell density levelization procedure as shown at the beginning of FIG. 1B. It should be noted that various combinations of the algorithmic steps described herein can be used. Algorithmic steps can be deleted as desired and as appropriate for the particular circumstances presented. Once the cell placement is determined by the methods in accordance with the present invention, the cells can then be placed on a silicon wafer in order to construct the desired integrated circuit.

The cell density levelization preferably begins with a dispersion-driven step 9 as described in §16. As this step is entered, the cells have been placed in positions on the surface that optimize given cost functions. However, the cell layout may not be feasible because cells may overlap, and the cells may have not been assigned to proper cell columns. Furthermore, the cell density may be very uneven, with resulting serious consequences for routing the wires on the chip. The sinusoidal optimization step 10 of §15, the dispersion-driven levelizing system 9 of §16 are performed globally to levelize the density of cells using global levelization procedures. Steps 9 and 10 are iterated as a block 22. Typically, about 5 iterations has proven effective.

Continuing with FIG. 1B, after global levelization has been performed, there may still be some density peaks in the core area of the chip. A preferred procedure for density peaks removal is described in §13. The procedure for density peaks removal 11 is sometimes referred to herein as the "bulldozer." The bulldozer is applied to remove the density peaks.

The sinusoidal optimization procedure 12 of §15 is applied to the chip surface subdivided into cell columns. The densities of cells in the columns are controlled to prohibit overflow and ensure that the cells are evenly assigned to the columns required by the structure of the final design. The sinusoidal optimization procedure is iterated as a block 23, generally, for a specified number of times, such as 5 times.

Subsection 1E: Cell Overlap Removal

The overlap removal procedure 13 of §14 is applied again without controlling the maximum distance between adjacent cells. The step removes any overlap that exists among cell outlines. This step is used to produce a physically feasible layout. Applying the overlap removal procedure at this part of the process removes cell overlap with minimal increase in average wire length.

Subsection 1F: Final Placement Crystallization

After applying the overlap removal procedure to remove the overlap, most of the cells are close to their final positions. The crystallization step places the cells in correct, final positions. Proper vertical cell spacing are computed so that horizontal wires can be routed over and between cells in the vertical columns. Vertical and local-horizontal "swaps" may be performed if doing so improves the cost functions. Cells must be assigned proper geometric coordinates so that their positions correspond to legal grid positions specified by the underlying chip architecture. All of these steps 14, 15, 16, 17, 18 and 19 are performed by the crystallization procedures described in §16. These procedure "freeze" the cells into their final positions. Steps 14, 15 and 16 are iterated as a block 24, generally a specified number of times, such as 10 times. Steps 18 and 19 are also iterated as a block 25 a specified number of times. At this point, the placement process is completed, and a data structure is prepared that can be read by the routing system for chip routing and design completion.

An exemplary integrated circuit chip is illustrated in FIG. 2 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

For a particular electrical circuit having predefined input and output terminals and interconnected in a predetermined way, the problem for the chip designer is in constructing a layout indicating the positions of the modules such that the area on the chip surface occupied by wires and the overall layout area are minimized.

The system shown in FIGS. 1A and 1B receives inputs for a user-specified integrated circuit design which includes a netlist. A connection between two or more interconnected elements of the circuit is known as a wiring net, or net. A netlist is a list of cells and nets.

Section 2: Neighborhood Construction

A hyperedge is a series of pins which are interconnected, i.e., wired together with an electrically common connection. For example, a hyperedge having pins A, B, and C means that pins A, B, and C are all connected together with a common metal wire. The "length" l(q) of a wiring net or hyperedge is equal to the number of pins (vertices) that are interconnected by the net minus one. This can be represented mathematically as $l(q)=|q|-1$, where q is the net and $|q|$ is the number of pins that are interconnected by the net q.

A particular cell, especially a large cell, can have two or more pins that are interconnected by one net q, and for this reason $|q|$ is the number of pins rather than the number of cells interconnected by a net q. However, for simplicity of description and illustration, the following examples will assume that each cell has only one pin connected to each net.

Figure 3:
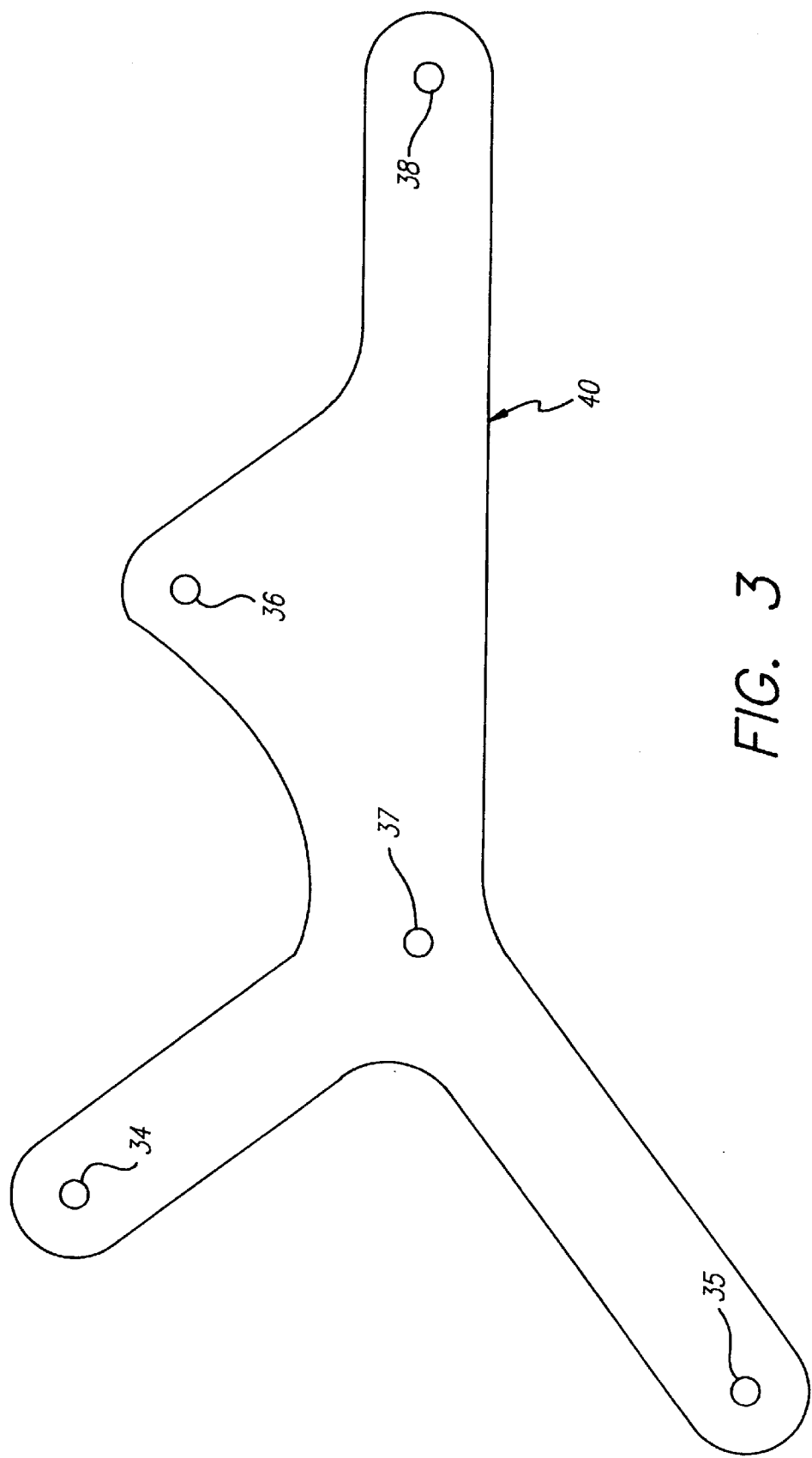
FIG. 3 is an illustration of a cell that has one pin connected to each net.

An example is illustrated in FIG. 3. A net q 40 is shown as interconnecting 5 cells 34, 35, 36, 37 and 38, that are collectively designated as w. The length of the net q is (5−1)=4. The cells w are illustrated as being spaced from each other and enclosed in an oblong shape which represents the net q. This is for illustrative purposes only, as it will be understood that the net q does not have any specific shape, and merely specifies that individual pins (not shown) of the cells w are to be interconnected. This arrangement is referred to as a hyperedge.

A distance $\rho(v_1,v_2)$ between two given vertices $v_1$ and $v_2$ is defined as the length of the shortest path between the vertices, where the length of a path is the sum of the lengths of the nets (hyperedges) that constitute the path.

Figure 4:
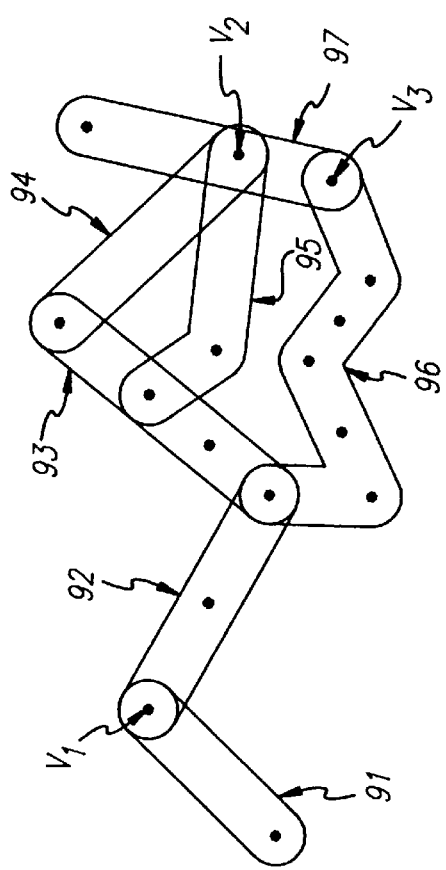
FIG. 4 illustrates seven nets, each of which interconnect a plurality of cells.

FIG. 4 illustrates seven nets $q_1$ to $q_7$, each of which interconnect a plurality of cells w. The distance between two given cells or vertices $v_1$ and $v_2$ is the length of the shortest path through the nets $q_1$ to $q_7$ that interconnects the cells.

The cell $v_1$ is common to the nets $q_1$ and $q_2$. However, there is no path from the cell $v_1$ to the cell $v_2$ through the net $q_1$.

There is a path from the cell $v_1$ to the cell $v_2$ through the nets $q_2$, $q_3$ and $q_4$, and another path through the nets $q_2$, $q_3$ and $q_5$. The lengths of the nets $q_2$, $q_3$, $q_4$ and $q_5$ are (3−1)=2, (4−1)=3, (2−1)=1, and (3−1)=2 respectively. The length of the path through the nets $q_2$, $q_3$ and $q_4$ is (2+3+1)=6, and the length of the path through the nets $q_2$, $q_3$ and $q_5$ is (2+3+2)=7. The path through the nets $q_2$, $q_3$ and $q_4$ has the shorter length, more specifically 6. If there is no other path (not shown) that is shorter, the distance between the cells $v_1$ and $v_2$ is defined as the length of this path.

FIG. 4 also illustrates how to measure a distance $\rho(v,q)$ between a cell v and a net q. This distance can be expressed mathematically as $\rho(v,q)=\min_{w \in q}\rho(v,w)$, and is the shortest path between the vertex v and any pin w in the net q.

Measurement of the distance between the cell $v_1$ and the net $q_7$ will be taken by way of example. There is a path from the cell $v_1$ to a cell $v_3$ in the net $q_7$. The length of this path is the sum of the lengths of the nets $q_2$ and $q_6$, which has a value of (2+6)=8. However, the path from the cell $v_1$ to the vertex $v_2$ through the nets $q_2$, $q_3$ and $q_4$ is the shorter path between the cell $v_1$ and any cell w in the net $q_7$, having a value of 6 as described above. If there is no other path (not shown) that is shorter, the distance between the vertex $v_1$ and the net $q_7$ is therefore defined to be 6.

In accordance with the present metric, a "range" $\text{range}_v(q)$ of a net q from a center cell v of a cluster or neighborhood (to be described in detail below) can be expressed mathematically as $\text{range}_v(q)=\rho(v,q)+l(q)$. In other words, the range is the distance from the center cell v to the net q plus the length of the net. The range of the net $q_7$ from the cell $v_1$, for example, is equal to the distance $\rho(v,q)$ from the cell $v_1$ to the net $q_7$, plus the length of the net $q_7$, or (6+2)=8.

One further definition is necessary for understanding the present invention. A "border" is a list of all nets that have ranges equal to the index of the border. For example, a border having an index of 7 ($\text{border}_7$) is a list of all nets having ranges of 7. This can be expressed mathematically as $\text{border}_v(j)=$all nets q such that $\rho(v,q) \leq r$ and $\text{range}_v(q)=j$, where j is the index of the border and r is a predetermined maximum distance from the center cell v (to be described in detail below) to the net q.

The borders can be considered as a series of concentric shells or quantum levels, with each border having an incrementally higher index and including nets having an incrementally higher range than the border with the next lower index.

Figure 5:
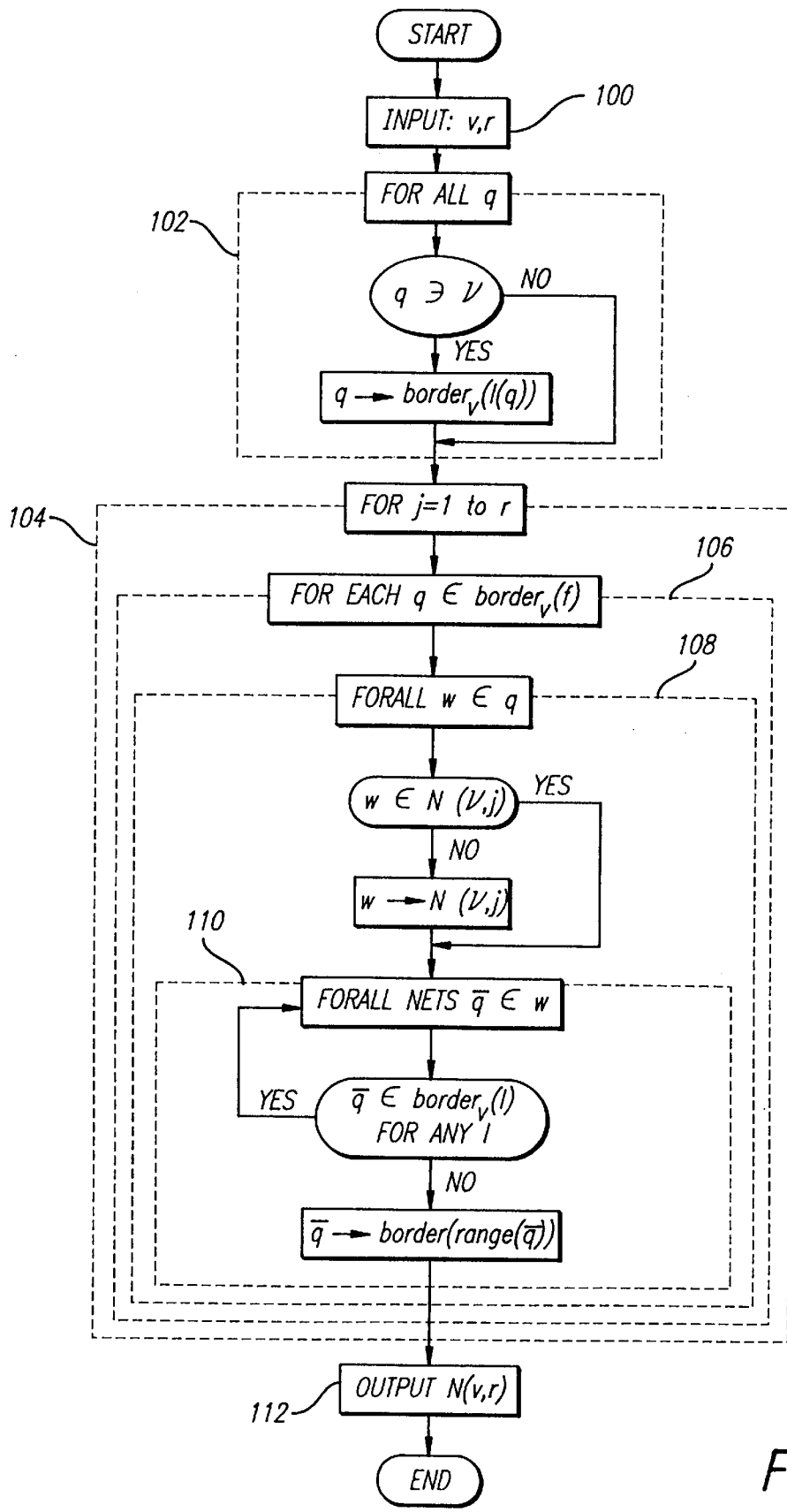
FIG. 5 is a flowchart illustrating the formation of a cell cluster or "neighborhood" in accordance with the present invention.

FIG. 5 is a flowchart illustrating the formation of a cell cluster or "neighborhood" N(v,M) in accordance with the present invention. The term "neighborhood" is illustrative of the fact that the clusters can be "fuzzy", with one cell being included in two or more clusters, and two or more clusters being allowed to overlap.

Initially, a target number M of cells are designated to be included in a neighborhood. A number of cells between 15 and 30 tends to work best, with the optimal number being about 20 cells in each neighborhood. The algorithm outlined below is executed until $C_1*M$ cells are collected within various neighborhoods. $C_1$ is a predetermined parameter. The preferred value of $C_1$ is 2.

The first step is to specify a particular cell v to constitute the center of the cluster N, and a value for M as indicated in a step 100.

The flowchart of FIG. 5 includes a plurality of nested loops indicated by broken lines. This notation indicates that all of the steps included within each loop are to be performed for all outer loops.

A step 102 which follows the first step 100 of inputting values of v and M is to determine which nets include the center cell $v_c$, and assigning all these nets to corresponding borders.

The next step, designated as 104, is to examine all borders, starting with $border_1$, in increasing order of index.

The next step 106 is to assign nets to borders in index order. A step 108 includes assigning all cells which are not in the neighborhood from the nets in the current border to the neighborhood. A step 110 includes assigning all nets which contain cells just included in the neighborhood, if these nets have not been previously assigned to any border, to corresponding borders. The cluster or neighborhood N(v,m) is output in a step 112.

Figure 6:
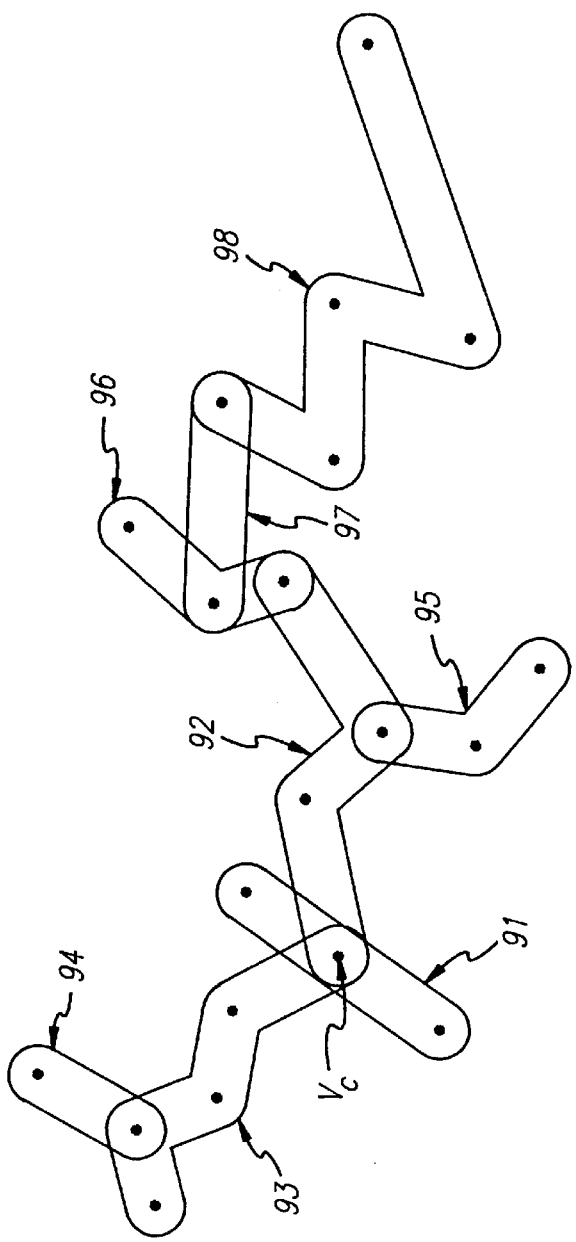
FIG. 6 is an illustration of a center cell and nets.

The method of FIG. 5 will be described further with reference being made to an example illustrated in FIG. 6. This example includes a center cell $V_c$ and nets $q_1$ to $q_8$.

Step 102 includes assigning all nets that include the center cell v to borders. The nets $q_1$, $q_2$ and $q_3$ all include the center cell v. Since the distances from the center cell $v_c$ to these nets is zero, the ranges of these nets are equal to their lengths.

The net $q_1$ has a length of (3−1)=2, and is assigned to $border_2$. The nets $q_2$ and $q_3$ have lengths 3 and 4, and are assigned to the borders $border_3$ and $border_4$ respectively.

In steps 104 and 106, the borders are examined in increasing order of index to determine if they include any nets. $Border_1$ does not include any nets. $Border_2$ includes the net $q_1$. Therefore, step 108 is performed, in which all cells w in the net $q_1$ are assigned to the cluster or neighborhood N(v,j).

In step 110, it is determined if there are any other nets connected to cells that were just assigned to the neighborhood. In this case, there are not, and the processing returns to step 104 to examine the next border.

The next border is $border_3$ which contains the net $q_2$. All of the cells w in the net $q_2$ (except v) are assigned to the neighborhood. The method then performs step 110 to determine if any other nets q̃ include any of the cells w (just included in the neighborhood) of the net $q_2$. In the illustrated example, the nets $q_5$ and $q_6$ include cells which are also included in the net $q_2$, and are thereby connected to the net $q_2$. If these nets have not been assigned to borders, then they are now assigned to the borders having indices equal to their ranges respectively. The ranges of both nets $q_5$ and $q_6$ are 5, so these nets are assigned to $border_5$.

The steps 104 and 106 are then performed for the next border, more specifically $border_4$ which includes the net $q_3$. In step 108, all cells of the net $q_3$ are assigned to the cluster or neighborhood. Then, step 110 is performed to determine if any other nets q̃ include cells which are also included in the net $q_3$. In this case, the net $q_4$ is connected to the net $q_3$. The net $q_4$ has a range of 5, and is assigned to $border_5$.

The next border is $border_5$, which contains the nets $q_4$, $q_5$ and $q_6$. No other nets are connected to $q_4$ and $q_5$, but all of the cells of the nets $q_4$ and $q_5$ are assigned to the cluster. All of the cells of the net $q_6$ are also assigned to the cluster. The net $q_6$ is connected to the net $q_7$, and $q_7$ is added to $border_6$.

Examination of the next border, $border_6$, indicates it contains the net $q_7$. All cells of the net $q_7$ are assigned to the cluster, if they were not assigned previously. Since the net $q_8$ is connected to the net $q_7$, the net $q_8$ may also be added to the cluster. The net $q_8$ has a range of 11, and may be assigned to $border_{11}$.

In this manner, clusters or neighborhoods are grown one border at a time until a maximum size is reached. In addition, the borders are grown by "hitting" nets having corresponding ranges through net interconnections starting at the center cell v.

Section 3: Optimization of Cell Neighborhood System

In the foregoing process of constructing neighborhoods, a list of the nets processed is generated. That list of nets includes all nets incident to cells included in the neighborhood. Once the neighborhood is established, coordinates are assigned to each individual cell. For each cell v, the neighborhood of the cell is constructed and optimized using the cell as the center. A target number of cells $C_1*M$ for the neighborhood is also defined. For purposes of relatively large VLSI chips, testing and operation has shown that about a twenty cell neighborhood yields effective convergence results. Larger or smaller neighborhood sizes may also be employed while still within the scope of the invention. An alternative measure for the parameter M is the total height of all cells in the neighborhood, with height defined as the physical y-axis dimension of an individual cell. A maximum total cell height may alternately be used to define the neighborhood size.

Figure 7:
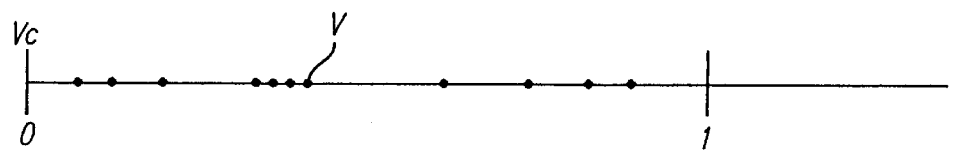
FIG. 7 shows that the cell v is assigned a coordinate between 0 and 1.

In accordance with the current invention, we assign coordinates to each cell and to each net in the neighborhood. We assign the center $V_c$ of the neighborhood the coordinate 0.0. We also assign the coordinates 1.0 to all cells not included in the neighborhood. Neighborhood cell assignment step assigns a cell v from the neighborhood coordinate values equal to $\rho(v_c, v)/R$, where $\rho(v_c, v)$ equals the length of the shortest path between the vertices $v_c$ and v, and R is the maximum radius value for the neighborhood. As seen in FIG. 7, v is necessarily not less than 0 and not greater than 1. We term the assigned coordinates "Z(v)" for each v.

Figure 8:
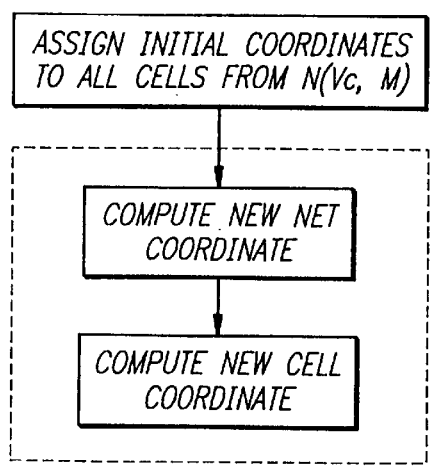
FIG. 8 is a flowchart illustrating the iteration of the recomputing of the net and cell coordinates.

As shown in FIG. 8, we then iterate recomputing of net and cell coordinates by iterating two procedures, as follow:

Procedure 1: The new net coordinates are computed such that for any net q within the set of nets Q, $$Z[q] = \frac{1}{|q|} \left( \sum_{v \in q} Z[v] \right)$$

where |q| is the number of pins of the net q. This equation sums the total of the current coordinates of the cell v and sums this for all cells in an individual net, then divides by the total number of pins on the net. The result of the summation and division is the coordinate of the net q.

Procedure 2: In new cell coordinate computation, for each cell v, the weight β[v] is represented by:

$$\beta[v] = \frac{1}{\Sigma \frac{1}{|q|}}$$

where for a net q, v is an element of q.
The new cell coordinate Z[v] is equal to:

$$\beta[v] * \Sigma \frac{1}{|q|} Z(q)$$

We apply the iteration procedure only on cells from the neighborhood except the center and only on nets that have at least one cell in the neighborhood. The iteration is generally accomplished for a pre-determined number of times, preferably 15 to 20 times.

Section 4: Iterative One Dimensional Preplacement Optimization

A one dimensional iterative optimization initially provides a fast, good cell coordinate placement. The one dimensional iterative optimization is performed in both the x and y directions. As may be appreciated by one of ordinary skill in the art, the iterative optimization may be performed in the y direction initially, but the preferred method is to perform it in the x direction. In the x direction, a netlist or hypergraph H includes the set V of cells v and the set Q of nets q. In addition, it should be noted that where "x" or "X" is used below for calculation in the x-direction, when calculating in the y-direction, "y" or "Y" would be used. As used herein, "z" and "Z" are universal notations representing either "x" and "X", on the one hand, or "y" and "Y" on the other, depending on which direction is being considered.

Figure 9:
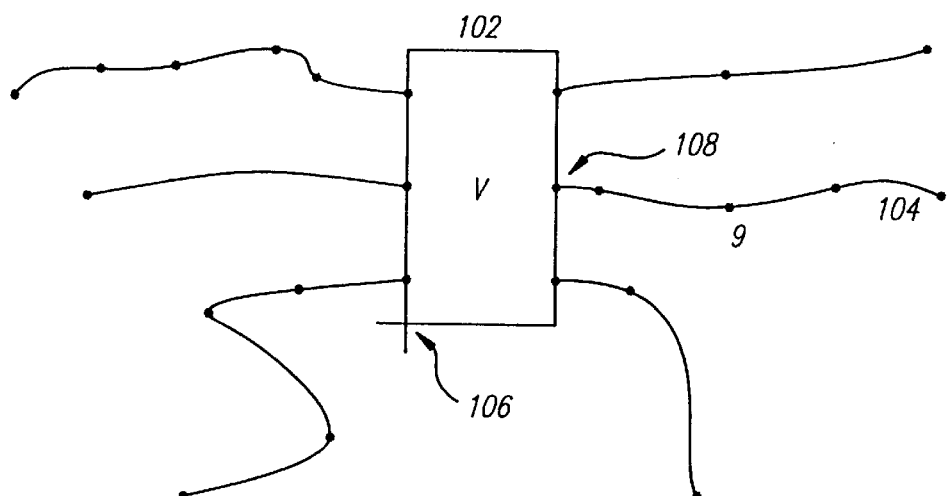
FIG. 9 illustrates a cell having several pins which belong to the net.

FIG. 9 illustrates a cell v 102 having several pins which belong to the net q 104. For purposes of pin offset definition for cell shifting and exact positioning purposes, the origin 106 of the cell defines the default "position" of the cell. If a net q 104 is being evaluated by the system, then the pin 108 on the cell v 102 which is on the net q 104 is positionally defined relative to the origin 106. Any point may be defined as the origin of the cell, including its center of mass, but the preferred embodiment is to define the origin at the physical lower left corner of the cell as shown in FIG. 9.

Figure 10:
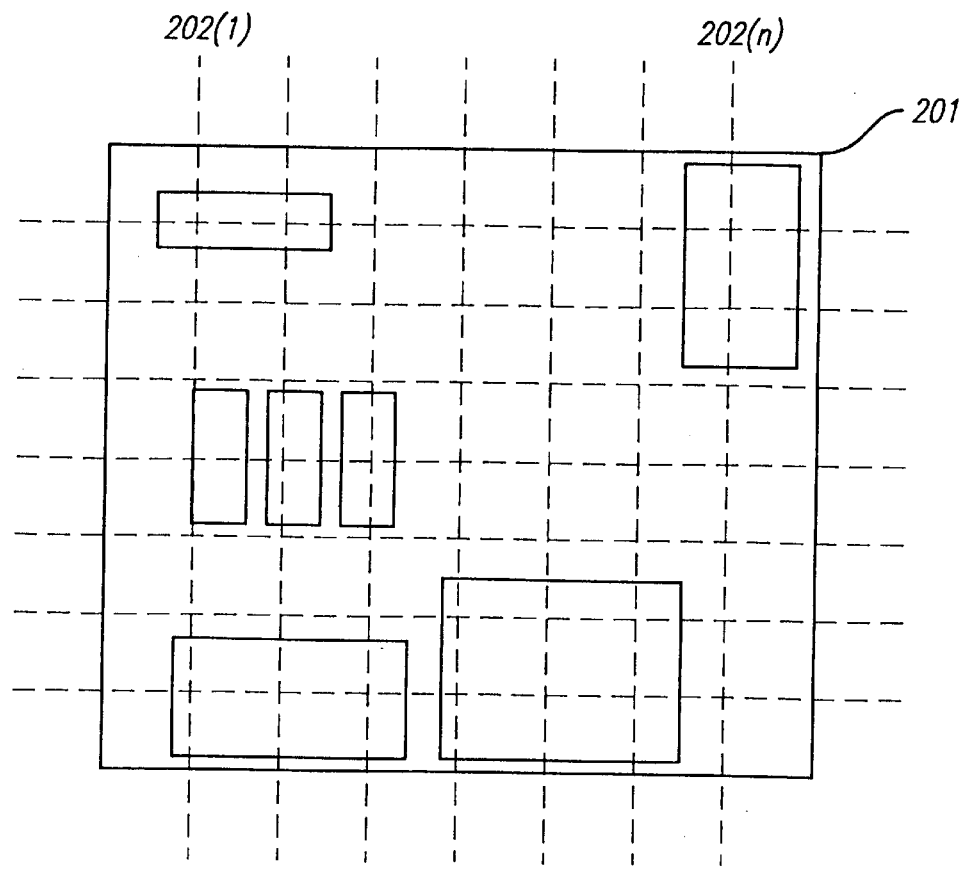
FIG. 10 is an illustration of a core divided into subregions.

As shown in FIG. 10, the core 201 is divided into subregions R. Initially, the preferred value of R is one, indicating the core is not subdivided. The subdivision of the core is represented by an array X[i] of x-coordinates of vertical dividing lines 202(1) through 202(n) and an array Y[j] of y-coordinates of horizontal dividing lines. For each interval X[i] and X[i+1], a dividing point is calculated to determine finer resolution. Each cell v belongs to some of these intervals, and the interval function I[v] is equal to i if the cell v belongs to the interval X[i], X[i+1]. The current coordinates of the cell v are denoted as Z[v], while the coordinates of the net q are denoted by Z[q].

Figure 11:
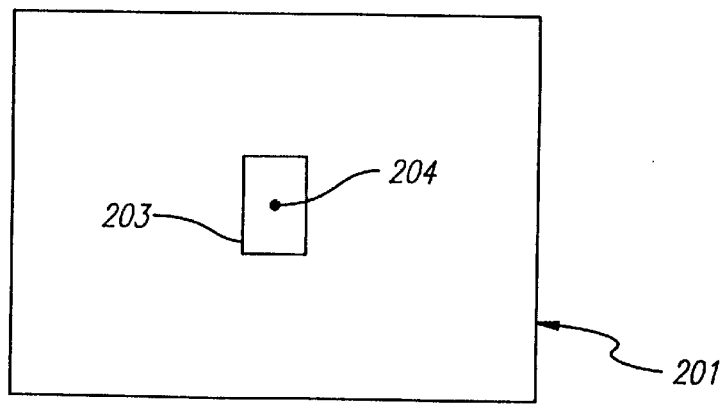
FIG. 11 is an illustration of a moveable cell within the core region.

In initial placement optimization initialization step 250, each movable cell coordinate is assigned a coordinate of a dividing point of the interval the cell occupies. Thus Z[v]= DX[I[v]]. DX is typically the midpoint of the interval, but the dividing point may be at a different location in each interval while still within the scope of the current invention. As shown in FIG. 11, for each moveable cell within the core region 201, the movable cell coordinate 203 is located at the dividing point 204 of the interval, which is a point at a percentage of the width or length of the core region 201. The preferred implementation is locating the dividing point 204 at the center point of the surface abstraction of the core region. Fixed cells are assigned their real coordinates.

Figure 12:
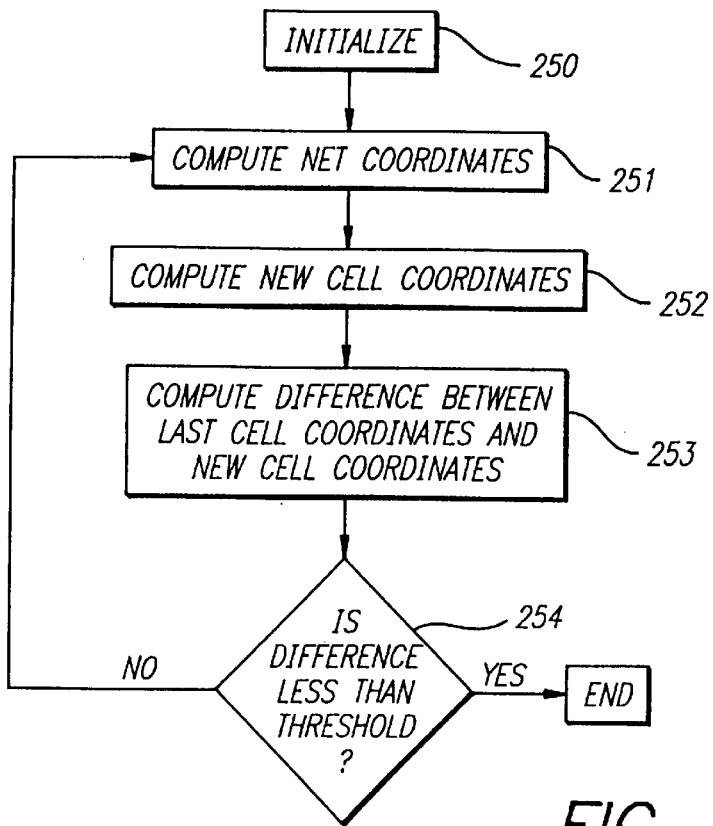
FIG. 12 is a flowchart that demonstrates the procedure for obtaining an initial one dimensional placement of the movable cells.

The flowchart of FIG. 12 demonstrates the procedure for obtaining an initial one dimensional placement of the movable cells. The movable cells are assigned the coordinate of the center of the region where they are located in initialization step 250. In net coordinate computation step 251, new net coordinates are computed. These new net coordinates are computed such that for any net q within the set of nets Q, $$Z[q] = \frac{1}{|q|} \left( \sum_{v \in q} ((Z[v] + z(v,q))) \right)$$

where |q| is the number of pins of the net q. This equation sums the total of the current coordinates of the cell v and the z-offset (x or y depending on the direction) of the pin on the cell which belongs to the net q, and sums this for all cells in an individual net, then divides by the total number of pins on the net. The result of the summation and division is the coordinate of the net q.

In new cell coordinate computation step 252, for each cell v, the weight β[v] is represented by:

$$\beta[v] = \frac{1}{\Sigma \frac{1}{|q|}}$$

where for a net q, v is an element of q.
For each interval X[i], X[i+1] and each cell v from that interval, the new cell coordinate Z[v] is equal to:

$$\beta[v] * \Sigma \frac{1}{|q|} Z^*(q,i)$$

Z* (q,i) is calculated by determining a temporary value a, where a initially equals Z[q]. If a is greater than X[i+1], or is outside the interval, then a is set to the greater border condition, or equal to X[i+1]. If a is less than X[i], again outside the interval, then a is set to the lesser border condition X[i]. Finally, Z* (q,i) is set equal to a.

Figure 13:
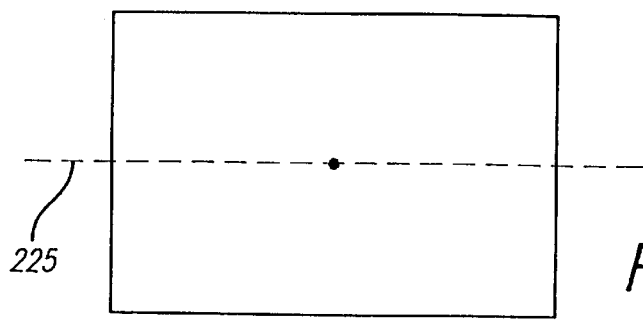
FIG. 13 is an illustration of the coordinates of the nets along an imaginary line.
Figure 14:
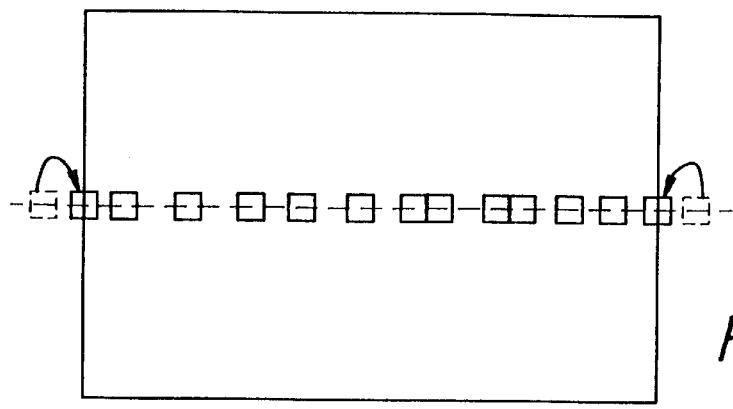
FIG. 14 is an illustration of the coordinates of the nets along an imaginary line.

This set of steps places the coordinates of the nets along an imaginary line as shown in FIG. 13, line 225. Cells are placed along this line based on the results of the initial Z(v) calculation described above, and these positions are subsequently iteratively moved to new positions in the region. The positions of cells within the region are shown in FIG. 14, which includes positions where some of the nets are initially outside the region. These out of bounds nets are then set to the edge of the region.

Once the new cell coordinates are computed, the difference between the previous value of the cost function and the new value of the cost function is determined in step 253. The typical cost function used is wire length and the cost function is computed as the average of the half-perimeters of boundary boxes for all nets. The typical cost function used is wire length and the cost function is computed as the average of the half-perimeters of boundary boxes for all nets. This difference is evaluated in step 254, and if the difference is not below a predetermined threshold, the cell positions are iterated by repeating net coordinate computation step 251 and new cell coordinate computation step 252. This iteration procedure is repeated for a number of times, such as one hundred times, or until the difference in cost function of two consecutive iterations is less than a predetermined threshold, such as 0.001 microns. A unit may be any measure, but the preferred distance threshold is 0.001 microns. The number of iterations and the threshold may vary while still within the scope of the invention.

Section 5: Fast Procedure for Finding a Levelizing Cut Point

The surface abstraction, or core region 201, denotes a region R[i,j]. The previous one dimensional fast preplacement procedure provides a given dividing point DX[i], if the region is divided horizontally, or DY[j] if the region is divided vertically. This dividing point may be anywhere along the line containing the cells from the previous procedure, but the preferred location is the midpoint of the line.

Figure 15:
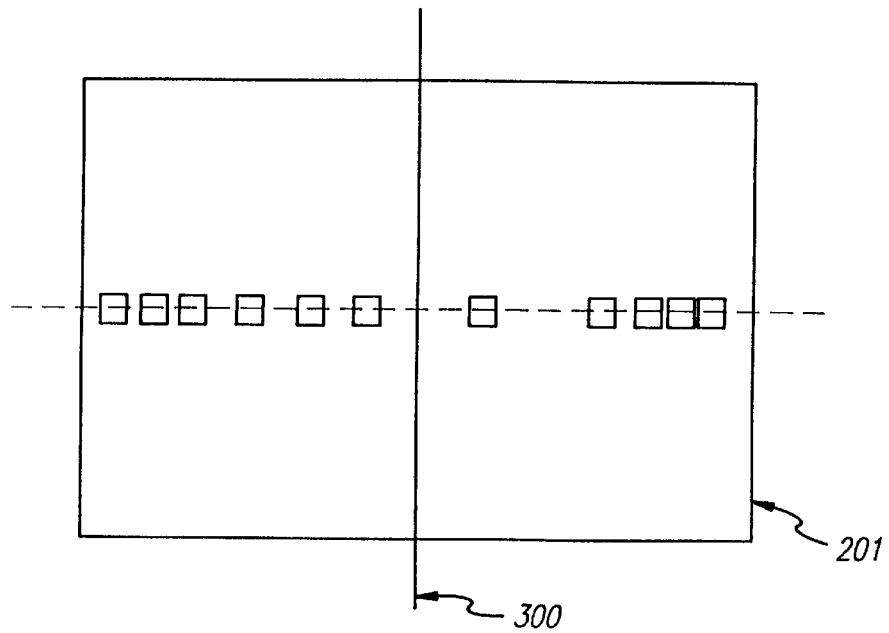
FIG. 15 is an illustration of the placement of nets along the line in the direction partitioned along a dividing line providing two subregions containing the cell positions.
Figure 16:
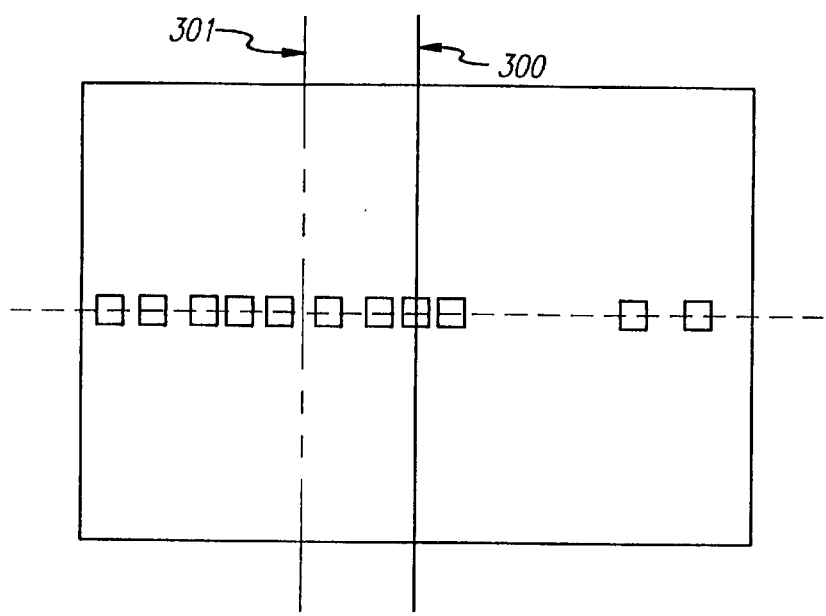
FIG. 16 is an illustration of a region physically divided in half by a dividing point.

The dividing point in the current example generates two subregions in the region R[i,j]. As shown in FIG. 15, the placement of nets along the line in the x direction is partitioned along a dividing line 300 providing two subregions containing the cell positions. The capacity of each of these regions is the area of the regions without all fixed cells or blockages. The capacities of the two regions are cap0 and cap1. A cut point, $Z_0$, is desired which divides the cells such that a percentage of cells or cell heights is proportional to the size of the region. For example, if a 50% cut point is desired, the required location for the cut point is where the two regions, defined by the physical 50% border dividing the surface abstraction, would have equal numbers of cells or of cell heights. As shown in FIG. 16, a region physically divided in half by a dividing point 300 may not have a cut point and cut line 301 coexistent with the region dividing point. The sum of all heights of all cells having coordinates lower than $Z_0$, or of the total quantity of cells having coordinates lower than $Z_0$ must not be greater than $$\frac{cap0}{cap0 + cap1}$$

and the sum of all heights of all cells having coordinates greater than $Z_0$, or of the total quantity of cells having coordinates greater than $Z_0$ must not be greater than $$\frac{cap1}{cap0 + cap1}$$

It is preferable to use the total of all cell heights, but other parameters, such as the number of cells, may be used while still within the scope of the invention.

Figure 18:
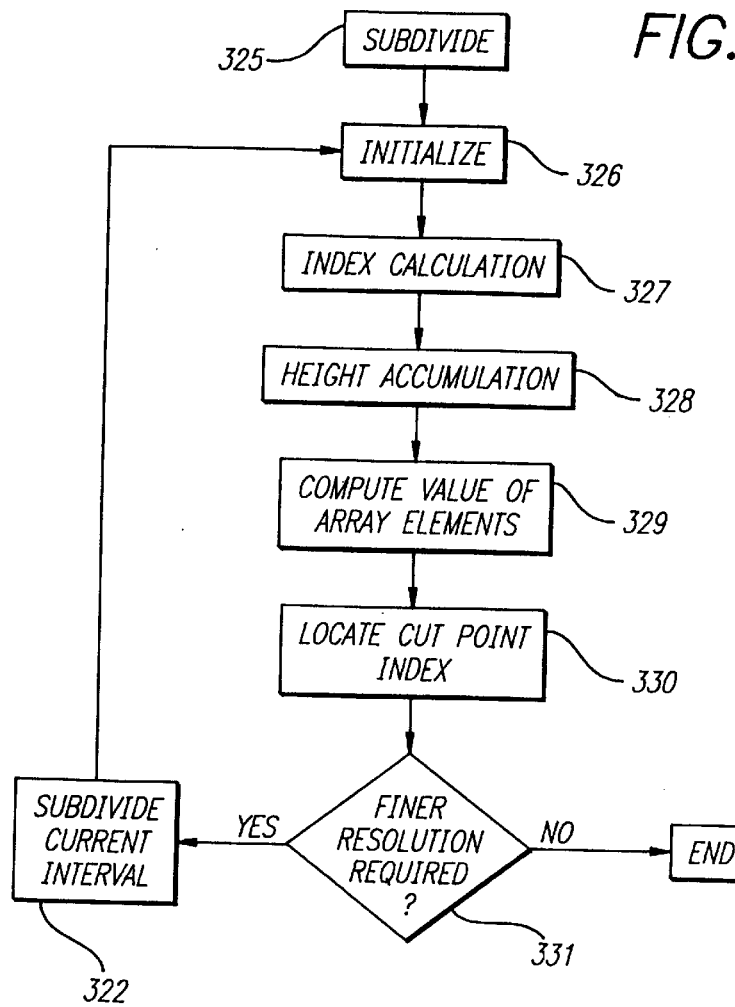
FIG. 18 is a flowchart relating finding a levelizing cut point.

Initially, if all cells within a given region R[i,j] are within an interval (A,B), the (A,B) interval is subdivided into N equal subintervals in subdivision step 325 as shown in FIG. 18. Initialization step 326 initializes an array S[k] having N elements, stores the sum of heights of all cells having subintervals with indices less than or equal to k, and initializes all the elements of array S[k] with the value zero. For each cell v within the region R[i,j], index calculation step 327 computes an index n(v) of the subinterval where the cell v coordinate is located:

$$n(v) = ]\frac{(Z(v) - A)}{(B - A)/N}[$$

As an example, assume (A,B) is an interval from 0 to 200 and 10 equal subintervals are desired. In fact, a number in the range of 1000 such intervals would normally be desired, but 10 is used here for purposes of illustration. Further, assume that one cell is located in each of the ten subintervals, as shown in FIG. 17, although it would be probable that subintervals would contain more than one cell. Assigning A has a value of zero, and B a value of 200, n(v) for a cell in this arrangement is equal to the minimum integer value greater than Z(v)/10 for the cell. The designation "]x[" denotes take the minimum integer greater than x, such that for x having a value of 1.3, the value of ]x[ is 2.

This results in an integer value for a subinterval within the (A,B) region where the individual cell is located. Height accumulation step 328 accumulates the heights of the cells in each subinterval within the array S[k] according to the relationship:

$$S[n(v)] = S[n(v)] + h(v)$$

where h(v) is the height of cell v. Value of array elements step 329 calculates the values within S[k] by iterating for k equal to 2, k being less than or equal to N, incrementing k, $$S[k] = S[k-1] + S[k]$$

Cut point index locator step 330 locates the minimal index $k_0$ such that $$\frac{cap0}{cap0 + cap1} * S[N] \leq S[k_0]$$

The levelizing cut point, where cell height is equivalent to the percentage of area within the surface abstraction is equal to $$Z_0 = A + (k_0 - 0.5) * \frac{B - A}{N}$$

Clustering of cells within a single region, or at a border of a region, may provide an inaccurate cut point. In such a case, where the levelizing cut point requires a higher accuracy, the subinterval where the levelizing cutpoint is located may be again divided into N subintervals in subdivision step 332 and the procedure repeated, locating a second levelizing cutpoint.

Once the levelizing cutpoint is located, all cells are shifted according to the following procedure.

Section 6: Median Control and Increase in Resolution

Figure 19:
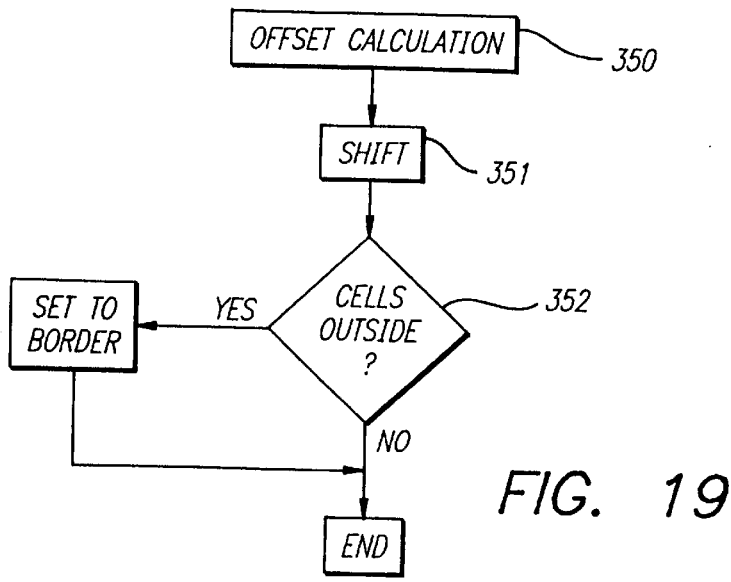
FIG. 19 is an illustration of the calculation step which determines the offset of the cut line from the dividing line.

For a given region R[i,j] having a dividing point D, the levelizing cut point $Z_0$ divides the cloud of cells proportionally to the capacities of the subregions induced by the dividing point D. From FIG. 19, offset calculation step 350 determines the offset of the cut line from the dividing line, where $\Delta$ is the difference between the coordinates of dividing point D and the levelizing cut point $Z_0$. Coordinates for each cell in the region are modified such that for any cell v within the region R[i,j], the cloud of cells is shifted in shifting step 351 such that the cut point is collocated with the dividing point:

$$a = Z[v] + \Delta$$

For cells outside the region, those cells are placed at the border of the region. If a is greater than X[I[v]+1] then a is equal to X[I[v]+1]. If X is less than X[i[v]], then a is equal to X[I[v]]. Z[v] is then set equal to this value a.

In the preferred embodiment, the system initially places all cells at the center of the two-dimensional abstraction of the chip surface. The system then performs a predetermined number of iterations of the One Dimensional Preplacement Optimization in one direction, such as the x direction. The surface abstraction is then subdivided into sub-regions by dividing the surface abstraction in the opposite direction. The system then uses the Levelizing Cut Point procedure to partition the cells into groups proportional to the capacities of the subregions. The Median Control procedure then modifies the coordinates of the cells. The Levelizing Cut Point and Median Control procedures are iterated a specified number of times (preferably 6) with the specified number of iterations comprising a Block. The average cost function is computed after a Block is performed. After each Block, an overall cost function, described below, is computed. After repeating this Block a predetermined number of times (typically 10), the system computes the average cost of each cost calculated during these Block iterations. The current average cost value is compared with the previous average cost value, and if the difference between the average value and the previous value is less than a predetermined value (such as $10^{-3}$), the procedure for the first level of hierarchy is complete. Cells are then assigned to the respective sub-regions depending on the calculated coordinates.

If the average cost function has not decreased by a specified amount, further Blocks of computations are required. At the end of this iterative procedure the cells are assigned to subregions in such a way that the capacities of the subregions are not violated.

After assignment of the cells to a respective subregion, as is described in §1 above, the system may repeat the aforementioned procedures based on a cut in the opposite direction. If, for example, the initial iterative one-dimensional preplacement optimization divides the available space on the surface abstraction by a vertical line, or divides in the x direction, the system executes the finding of a levelizing cut point procedure and the median control and resolution increase procedure in this direction. Upon completion of these procedures, the cells are assigned to one of the two regions, and the procedure may be repeated in the y-direction, based on the cells located in the two regions, after other optimization procedures discussed below are completed. As shown in FIG. 20, the two regions are divided using two dividing lines in the y direction and cells are placed along these two lines. The system locates a levelizing cut point for each region and partitions out the cells to the four remaining cells. This division in the y direction creates a second level of hierarchy.

For purposes of this patent specification, hierarchy levels are determined based on the number of divisions of the surface abstraction. The level of hierarchy is the sum of the number of times the surface abstraction is divided into separate regions. For example, if the surface abstraction has been divided three times in the x direction and two times in the y direction, the system has reached the fifth level of hierarchy. The total number of regions is equal to $2^{(Levelx+Levely)}$, with "Levelx" meaning the number of occasions that the surface abstraction has been divided in the x direction and "Levely" means the number of occasions that the surface abstraction has been divided in the y direction. Thus, in the previous example, 32 regions exist at the fifth level of hierarchy.

Section 7: Universal Affinity Driven Discrete Placement Optimization

After each surface abstraction division, the system performs a discrete placement optimization. For purposes of illustrating this procedure, it is assumed that the previous routines have furnished two sets of cells partitioned into two regions on the surface abstraction. All cells are located in the centers of each region.

The system calculates affinities and cost functions for the arrangement. An affinity is calculated based on current cell placement and blockages in a chip. Affinities are heuristically connected with a desired cost function, which should be minimized. Affinities can be driven by cell density, wire length, minimizing maximal cut, clustering, etc., or some combination of these parameters depending on the goal sought to be achieved. Affinities may be positive or negative, and relate to the quality of an alternate placement of a cell. For example, having a cell with a higher affinity at a first location and a lower affinity at a second location indicates that the preferred placement of the cell is the first location.

Figure 21:
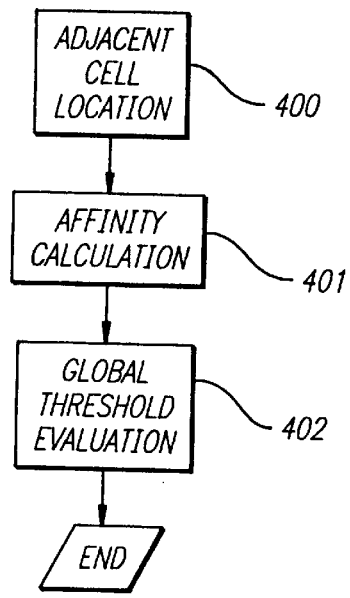
FIG. 21 is an illustration of adjacent cell location step which initially considers moving a cell from its current position to each of the adjacent regions, as well as considering leaving the cell in the current region.

The parameter of the discrete placement optimization is $\epsilon$, which represents the accuracy of the placement, and is a small number, such as $10^{-3}$ or $10^{-4}$. From FIG. 21, adjacent cell location step 400 initially considers moving a cell from its current position to each of the adjacent regions, as well as considering leaving the cell in the current region. For higher levels of hierarchy (i.e., a substantial number of regions), nine total regions are evaluated for cells not located on an edge of the surface abstraction. Affinity calculation step 401 calculates, for each adjacent region, the maximum affinity of the cell is moved to these adjacent regions. The total number of cells having an affinity greater than a predetermined value p is denoted $N_p$. For the initial placement received from the preceding procedural steps, the affinities for the cells are calculated and ordered according to these affinities.

Global threshold evaluation step 402 finds a threshold number, Globthresh, such that the total number of cells, $N_{GlobThresh}$, having an affinity greater than the threshold number, is less than $\epsilon$ multiplied by the number of all cells having positive affinities, or $N_0$. Practice has shown that optimal results occur for $\epsilon$ having a value of from 30 to 40 percent.

Figure 22:
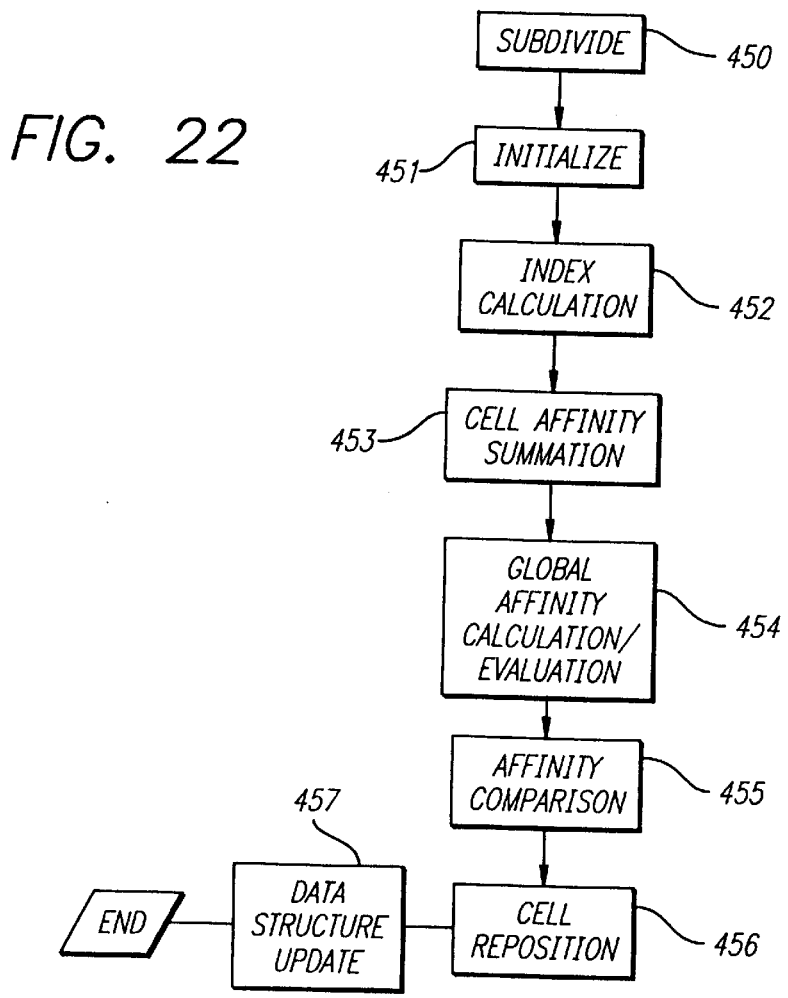
FIG. 22 is an illustration of the (A,B) interval which is subdivided into equal subintervals in subdivision step 450.

The overall global threshold is determined using a similar procedure to that described above with reference to the procedure for finding the levelizing cut point. The affinities are ordered sequentially, and all cells are defined to be within an interval (A,B), exclusive of negative affinities. With reference to FIG. 22, the (A,B) interval is subdivided into k equal subintervals in subdivision step 450. Initialization step 451 defines an affinity array A[i] having i elements. The initial value of all elements of this array is 0. A[i] stores the number of cells whose affinities are greater than or equal to (k−i)*L, where L is the length of the subinterval within (A,B). For each cell v, calculation step 452 computes an index i(v) of the subinterval where the cell v affinity is located:

$$i(v)=K+1-]MaxAff(v)/L[$$

MaxAff(v) is the maximum affinity over all adjacent regions for the cell v. This calculation yields an integer value denoting a subinterval within the (A,B) region where the individual cell affinity is located. Now for each cell v we increase the appropriate element of the array by 1 such that A(i(v))=A(i(v))+1. Cell affinity summation array step 453 calculates the value of A[i] by iterating for i equal to 2, i being less than or equal to k, incrementing i, $$A[i]=A[i-1]+A[i]$$

Global affinity evaluation step 454 determines the global affinity threshold GlobThresh using the previous equation such that GlobThresh is equal to i where i is the minimum i such that $N_0 \cdot \epsilon$ is less than or equal to A[i].

After calculating GlobThresh, the system evaluates the list of all cells in a predetermined sequential order. Affinity comparison step 455 calculates the maximal affinity for the present region and for each adjacent region. If the affinity for an adjacent region is greater than the global threshold GlobThresh, the cell is placed in the new region in cell repositioning step 456. The original cell position data structure is updated in data structure update step 457. Then steps 455, 456 and 457 are iterated as a block 458, generally 3 times.

The result of this procedure is a global threshold for all cells. Some cells have been moved to adjacent regions, altering affinities of other cells. The procedure is then repeated two more times, for a total of three iterations, through the list of all movable cells using the same threshold.

As an additional and optional procedure, a local threshold can be calculated in addition to the global threshold. The local threshold is calculated in the same fashion as the global threshold, but with respect to only the cells from the region where the cell is located. If we use this additional, optional procedure, we move the cell only if the maximal affinity is greater than both the global threshold and the local threshold.

An average cost function, representing the average of the three values of the cost function calculated after each iteration, is computed. Now we compute a new threshold as described above in step 454. This entire procedure, from threshold computation through cost function computation (block 459), is repeated a predetermined number of times (usually 10 times). Each time block 459 is repeated the predetermined number of times, the average value of the average cost function is calculated and compared with the previous average value of the average cost function value. If $$AvgCost_{i-1} < (1+\delta)*AvgCost_i$$

then the optimization process is halted. $\delta$ is a small number, typically $10^{-3}$ or $10^{-4}$.

Section 8: Density Driven Capacity Penalty System

The surface abstraction is partitioned alternately in the vertical and horizontal directions, where each division denotes an additional level of hierarchy. The levels of hierarchy, $Lev_x$ and $Lev_y$ determine the number of hierarchy levels. The number of grids, or channels of regions, in each direction are given as $Grid_x$, equal to $2^{Lev_x}$, and $Grid_y$, equal to $2^{Lev_y}$. Each region on each level of hierarchy is determined by ($Lev_x$, $Lev_y$, i, j) where i and j are the indices of corresponding surface abstraction segments. The capacity of each region is a function of these four parameters. The system then calculates the sum of the heights in each region.

Figure 23:
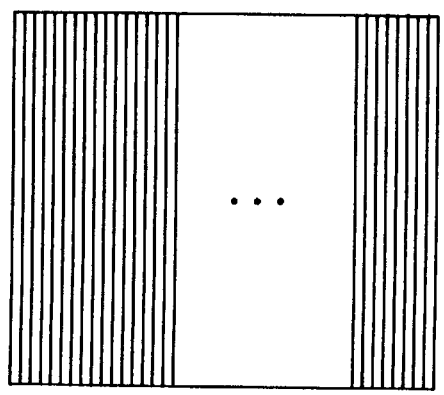
FIG. 23 is an illustration of the cell region having a certain number of columns, or possibly rows, located therein.

The system then calculates a region capacity in terms of the heights of cells which can be located within a single region. This capacity of cell heights accounts for rows or columns of locations where cells may be located. As shown in FIG. 23, the cell region will have a certain number of columns, or possibly rows, located therein. The cell height capacity represents the space available to individual cells within the region and is based on the hierarchy of the surface abstraction. As outlined below, the highest level of hierarchy defines a single column per region. As may be appreciated by one of ordinary skill in the art, rows may be used rather than columns to define a total cell width capacity rather than a height capacity.

All cells are located at the center of a region during some phases of the placement procedure. The height of a single cell may extend into more than one region. A parameter ColKey is assigned to this placement system process. The center of each cell is assigned to the center of the region it occupies. If ColKey has a value of 0, the entire height of the cell is located within a single region. If ColKey is equal to 1, the height of the cell is distributed to the regions the cell overlaps. For example, if a cell has a height of 16 units while the region has a height of ten units, three units are assigned to the cell above and three to the cell below the current cell. Cells located in an edge region are assigned to the region away from the edge, and not to any region outside the edge. Hence in the example previously presented, ten units of the cell would be assigned to the edge region and three to the region above the edge region.

Movement of the cells from one region to another requires updating the total of the heights in each region.

Figure 24:
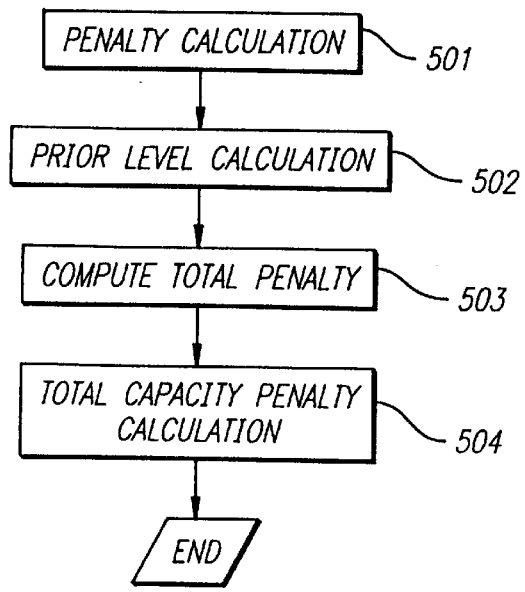
FIG. 24 is an illustration of the penalty calculation step 501.

Each cell v is located within regions with indices I[v] and J[v], in the x and y directions, respectively. Movement of a cell to an adjacent region is denoted by $\Delta_i$ and $\Delta_j$, where $\Delta_i$ is a movement in the horizontal direction, with a rightward movement being +1, and $\Delta_j$ representing vertical movement, upward yielding a +1 value. $\Delta_i$ and $\Delta_j$ each are set at either −1, 0 or +1. From FIG. 24, penalty calculation step 501 computes a penalty, PenCapB(v,$\alpha$,$\Delta_i$,$\Delta_j$), equal to the following values:

$$\frac{SumHeight[I[v]][J[v]]}{Cap[I[v]][J[v]]} * 2^k$$

for $\Delta_i$ and $\Delta_j$ both equal to zero; and $$\frac{SumHeight[I[v]+\Delta_i][J[v]+\Delta_j] + \alpha*h(v)}{Cap[I[v]+\Delta_i][J[v]+\Delta_j]} * 2^k$$

otherwise (i.e., either or both $\Delta_i$ and $\Delta_j$ have a value other than 0 (−1 or +1)).

$\alpha$ represents the degree of counting, which affects the movability of a cell v to a new region. $\alpha$ will typically have a value between 0.1 and 1. Prior level calculation step 502 computes the penalty for the regions three levels before the current level. For example, if the current hierarchy divides the surface abstraction into 64 by 64 total regions, then three levels before has 8 by 8 regions. A total of 64 eight by eight regions will fit into a 64 by 64 area. The total penalty, PenCap8(v,$\Delta_i$,$\Delta_j$), is calculated in the same manner as the PenCapB calculation in total penalty computation step 503. The total capacity penalty is calculated in step 504 according to the following formula:

$$PenCap(v,\Delta_i,\Delta_j) = \lambda * PenCapB(v,\alpha,\Delta_i,\Delta_j) + Sw * \lambda_{ad} \cdot$$
$$PenCap8(v,\Delta_i,\Delta_j) + ColKey * \lambda_{col} * PenCapCol(v,\beta,\Delta_i,\Delta_j)$$

where $\lambda$ is the capacity penalty weight in the total affinity, and Sw is a switch parameter set to 0 or 1 depending on whether use of the PenCap8 variable is desired. PenCap8 is used only when the area is divided into 16 by 16 regions or more. $\lambda_{ad}$ and $\lambda_{col}$ are the relative weights of corresponding penalties. The use of these various penalties allow the user to drive the placement based on predetermined desired characteristics. If capacity in individual columns is to be penalized more than other capacity weights, then the value of $\lambda_{col}$ is greater than the other $\lambda$ factors, i.e. $\lambda$ and $\lambda_{ad}$, where all $\lambda$ factors are between zero and one. While design and performance are generally a matter of choice, experience has demonstrated that $\lambda$ may initially be set to the following value:

$$\lambda = \lambda_0 * \frac{CoreX}{GridX * GridY}$$

where $\lambda_0$ ranges between 0.5 and 1.5, and CoreX is the x dimension of the core. The values initially selected for $\lambda_{col}$ and $\lambda_{ad}$ are 16 and 16.

Section 9: Wire Length Driven Affinity System

An alternate embodiment of the current design is to calculate affinities and penalties according to the relative wire lengths of different designs. This procedure provides a set of affinities providing the minimal wire length over all feasible placement solutions.

For each cell v and net q, the minimum and maximum values for the X component penalties are as follows:

$$X_{min}(v,q) = min_{w \neq v, w \in q}(X(w) + x(w,q))$$

$$X_{max}(v,q) = max_{w \neq v, w \in q}(X(w) + x(w,q))$$

where X(w) is the current coordinate of the cell origin, x(v,q) is a pin offset from the origin where the pin belongs to the net q. The y component penalties are similar:

$$Y_{min}(v,q) = min_{w \neq v, w \in q}(Y(w) + y(w,q))$$

$$Y_{max}(v,q) = max_{w \neq v, w \in q}(Y(w) + y(w,q))$$

Figure 25:
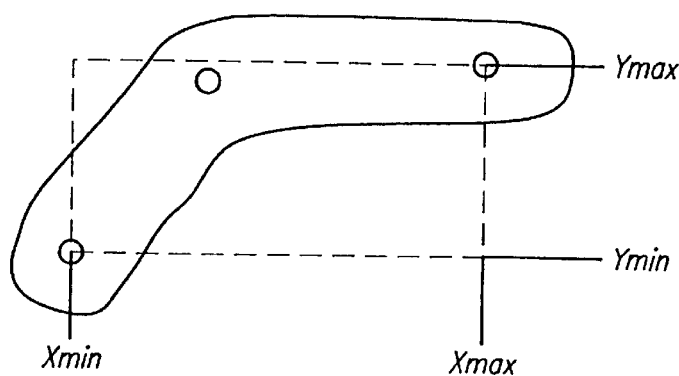
FIG. 25 is an illustration of a three pin net.

These equations define a bounding box 550 containing the net q 551, as shown for a three pin net in FIG. 25.

The borders of the region where the cell v is located are denoted by:

$X_l(v) = X[I[v]]$
$X_r(v) = X[I[v]+1]$
$Y_l(v) = Y[I[v]]$
$Y_u(v) = Y[I[v]+1]$

The penalty vector for cell v and net q in the x-direction is:

$(PenHP_x(v,q,-1), PenHP_x(v,q,0), PenHP_x(v,q,1))$

These values correspond respectively to movement of the cell to the left, nonmovement of the cell in the horizontal direction, and movement of the cell to the right.

The penalty vector for cell v and net q in the y-direction is:

$(PenHP_y(v,q,-1), PenHP_y(v,q,0), PenHP_y(v,q,1))$

These values correspond respectively to movement of the cell upward, nonmovement of the cell in the vertical direction, and movement of the cell downward.

The penalty vector for the individual situation is as follows. If $X_{max}$ is less than $X_l$, then the vector representation for the penalty in the x direction is (−1,0,1), indicating zero penalty for keeping the cell in its current location, a penalty of one for moving the cell to the right, and a penalty of −1 for moving the cell to the left. This indicates that a cell in the net is outside the left boundary of the region, and movement of the entire net to the right would be a penalty for the wire length. Movement of the cell to the left would be a negative penalty, or benefit, to the wire length. For $X_{min}$ greater than $X_r$, the penalty vector is (1,0,−1). For $X_{min}$ less than $X_l$ and $X_{max}$ less than or equal to $X_r$, the penalty vector is (0,0,1). For $X_{min}$ less than $X_l$ and $X_{max}$ greater than $X_r$, the penalty vector is (0,0,0). For $X_{min}$ greater than or equal to $X_l$ and $X_{max}$ less than or equal to $X_r$, the penalty vector is (1,0,1). For $X_{min}$ greater than or equal to $X_l$ and $X_{max}$ greater than $X_r$, the penalty vector is (1,0,0). Similar vectors result for positions of the cells in the y direction.

The total penalty for a cell v in the X direction is a normalized sum of the penalties in the X direction over all nets incident to the cell v:

$$PenHP_x(v, \Delta_i) = (XI[1] - XI[0]) * \sum_{q \ni v} PenHP_x(v, q, \Delta_i)$$

In the Y direction, $$PenHP_y(v, \Delta_j) = (YI[1] - YI[0]) * \sum_{q \ni v} PenHP_y(v, q, \Delta_j)$$

The total penalty is the sum of the x and y components:

$$PenHP(v, \Delta_i, \Delta_j) = PenHP_x(v, \Delta_i) + PenHP_y(v, \Delta_j)$$

The affinity is the opposite of the penalty:

$$AffHP(v, \Delta_i, \Delta_j) = -PenHP(v, \Delta_i, \Delta_j)$$

and a first combined affinity is calculated based on both capacity and wire length:

$$Aff(v, \Delta_i, \Delta_j) = AffHP(v, \Delta_i, \Delta_j) + QEF(v) * AffCap(v, \Delta_i, \Delta_j)$$

QEF(v) represents a scaling factor having the following parameters:

$$QEF(v) = \frac{\log\left(\frac{Height(v)}{Avg\ Height\ of\ All\ Cells}\right) + A}{B}$$

where Height(v) represents the height of the cell v. Although any values may be used for A and B in this equation, experience and testing has shown that the values of 5 and 5 produce the most beneficial results.

Section 10: Minimizing Maximal Cut Driven Affinity System

Another parameter used to produce an affinity for improving cell placement is minimizing the maximal number of nets that intersect the unit segment of the grid system imposed of the surface abstraction of the chip. Net overlap inherently yields inefficiency of wiring, and thus minimizing the number of nets which cross other nets improves overall system efficiency. For each level of chip core partitioning hierarchy, the number and position of the vertical and horizontal lines which induced the level of partitioning hierarchy are evaluated, including determining the number of nets which intersect a line partitioning the cell into regions. Initially, the system determines the number of nets which intersect the lines and the relative affinities for these line crossings. The system moves the cells and the nets change position based on relative affinities, and then the number of net crossings and affinities are recomputed.

Figure 26:
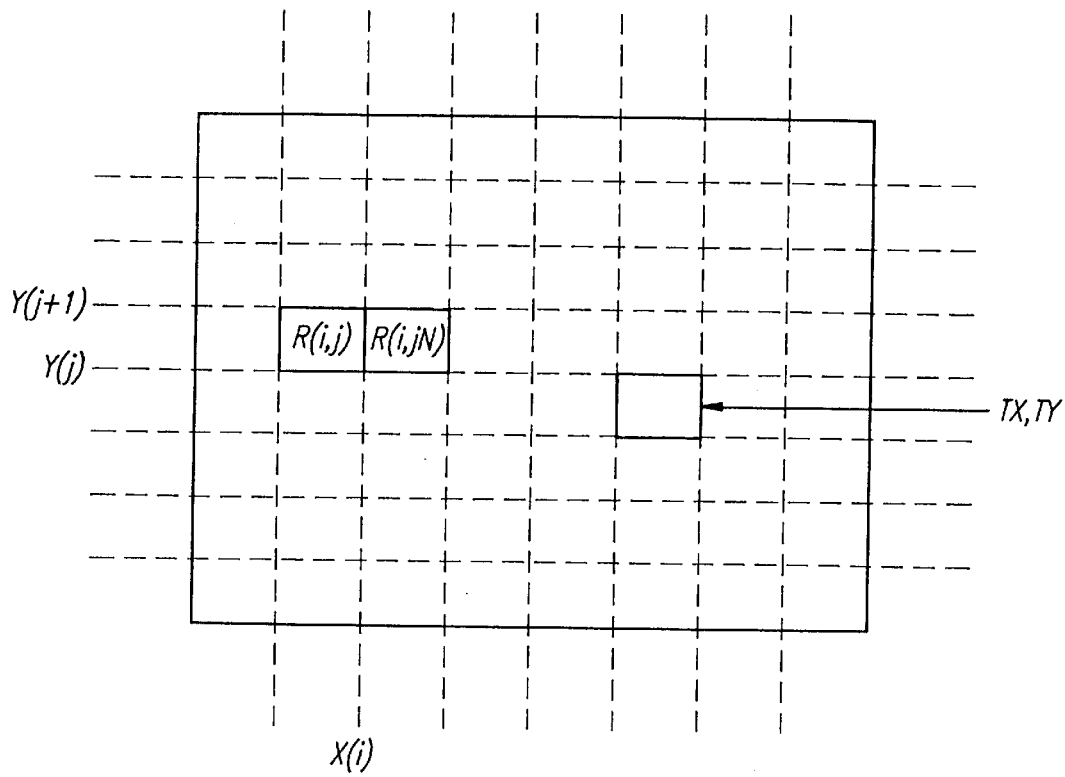
FIG. 26 is an illustration of each dividing line partitions regions, and each of these regions has a capacity denoting the volume of cells which can fit within the region.

As shown in FIG. 26, each dividing line partitions regions, and each of these regions has a capacity denoting the volume of cells which can fit within the region. The system performs the following procedure once after each bisection. The system calculates the capacities as an average capacity of regions adjacent to the dividing line. In FIG. 26, the capacity of dividing line X(i) is defined as the average capacity of all regions to the left of the line and all regions to the right of the line. The system calculates average vertical line capacity and average horizontal line capacity for all lines, representing the amount of wiring which is available over the entire surface abstraction. The capacity may also represent available space for wiring available on multiple layers of the chip. The capacity of each horizontal and vertical line is then divided by the corresponding horizontal or vertical average values. Hence, if the capacity of the line represented by X(i) in FIG. 26 has a capacity of 1500 cells and the average capacity of all vertical lines on the surface abstraction is 1000 cells, the relative cut of the line is 1.5. The ratio of the number of nets crossing a line and the capacity of the line are defined as the relative cut.

Figure 27:
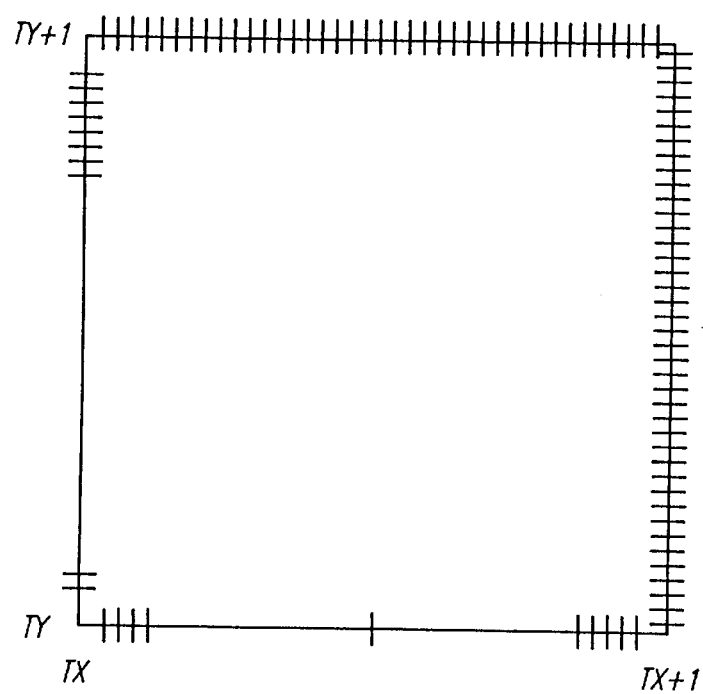
FIG. 27 represents a region having indices (TX, TY).

Before each optimization step in the affinity driven discrete placement optimization procedure, and particularly before calculation of global and/or local thresholds, the system calculates a midcut for the surface abstraction. The midcut represents the average relative cut over all lines of the surface abstraction. FIG. 27 represents a region having indices (TX, TY). The number of cuts represents, with the current cell configuration, the number of times a net crosses a boundary, while the capacity of the line represents the total number of possible crossings of the particular boundary. The system calculates four penalties which represent the cost of a change for a halfperimeter move of cells within the region one unit to the right, left, up, and down:

$$DXL = (XI[1] - XI[0]) * \left( 1 - \beta + \beta * \left( \frac{CutX[TX]}{CapX[TX]} /(Midcut) \right) \right)$$

$$DXR = (XI[1] - XI[0]) * \left( 1 - \beta + \beta * \left( \frac{CutX[TX+1]}{CapX[TX+1]} /(Midcut) \right) \right)$$

$$DYB = (YJ[1] - YJ[0]) * \left( 1 - \beta + \beta * \left( \frac{CutY[TY]}{CapY[TY]} /(Midcut) \right) \right)$$

$$DYT = (YJ[1] - YJ[0]) * \left( 1 - \beta + \beta * \left( \frac{CutY[TY+1]}{CapY[TY+1]} /(Midcut) \right) \right)$$

These equations, as illustrated in FIG. 27, represent the number of cuts over region dividing lines TX, TX+1, TY, and TY+1 relative to the capacity of the dividing lines. The XI and YJ factors represent the size of one region. The factor β represents the relative penalty associated with cuts, and testing has shown that a reasonable range for β factors is 0.4 to 0.5. As shown in FIG. 27, for a region twenty units in length on the x and y sides, with ten cuts along each dimension and a capacity for one hundred cuts, with an average number of cuts equal to twenty cuts, and a β factor of 0.45, the values for DXL and DYB are 11.045 each. For 40 cuts on the right hand side and upper side of the regions, the values are 11.18.

Discrete affinities in the x and y direction represent the numbers of nets whose halfperimeter decreases on movement of cells across the boundary minus the number of nets whose halfperimeter increases when a cell moves in a given direction.

$$AffX[i], i=-1,0,1; AffY[j], j=-1,0,1$$

Affinity for zero movement represents the numbers calculated above. Movement of a cell in a particular direction, such as crossing a boundary line, induces an affinity for that cell. From FIG. 27, movement of the cell to the right and up decreases the penalty, or increases the affinity for the cell. Thus affinity in the x direction, AffX, for movement to the right is −1, to the left is 1, and affinity for movement in the y direction, AffY for movement of the cell upward is −1, and downward is 1. Affinity for keeping the cell in its current position is 0.

The discrete affinities for movement in each of the four directions are multiplied by the corresponding factor:

$$AffcutX[-1]=AffX[-1]*DXL$$

$$AffcutY[-1]=AffY[-1]*DYB$$

$$AffcutX[1]=AffX[1]*DXR$$

$$AffcutY[1]=AffY[1]*DYT$$

Total affinities for movement of the cell in the vertical and horizontal directions are the summation of affinities in the X and Y directions:

$$Affcut[i][j]=AffcutX[i]+AffcutY[j]$$

An alternative embodiment of this procedure is to use the square of the number of crossings as a component of the cost of change for the halfperimeter move. For movement to the left, this would yield an equation of:

$$DXL = (XI[1] - XI[0]) * \left( 1 - \beta' + \beta'* \left( \frac{CutX^2[TX]}{CapX[TX]} /(Midcut) \right) \right)$$

Squaring the factors increases the emphasis on the number of cuts, and balancing with new β' factors yields an arrangement wherein the total number of cuts converge rapidly to a relatively uniform quantity.

Section 11: Neighborhood System Driven Optimization

Figure 28:
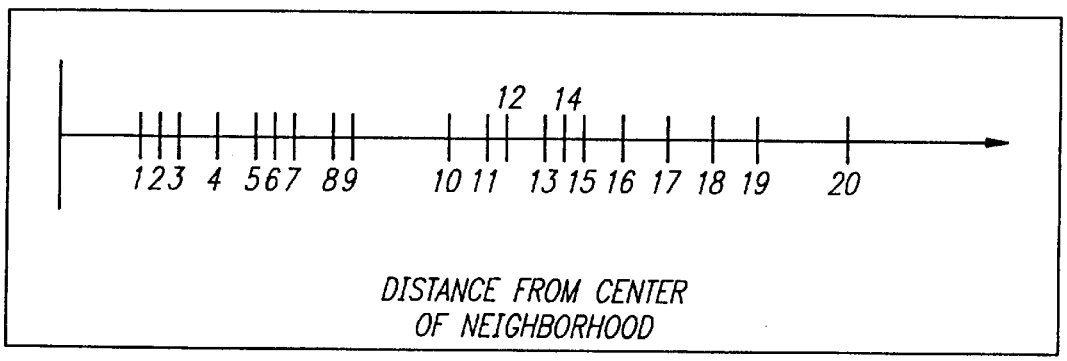
FIG. 28 illustrates an ordering of cells within the neighborhood.

Each moveable cell v is located within a neighborhood Neigh(v) constructed in accordance with the optimization of cell neighborhood system procedure outlined above. That procedure yields an ordering of cells according to the cells' distance from the center of the neighborhood, after optimization. FIG. 28 illustrates such an ordering of cells within the neighborhood, Neigh(v)=(w(v,1), w(v,2), . . . w(v,M)), where M is the size of the neighborhood, generally in the range of 20 cells.

Figure 29:
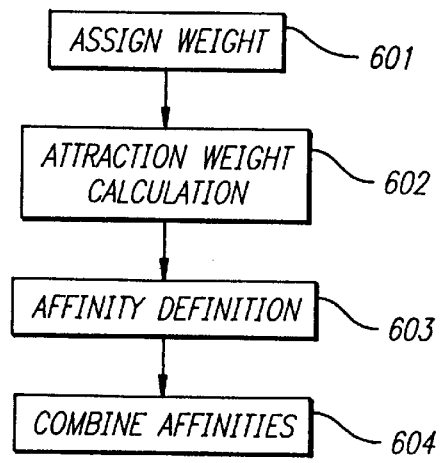
FIG. 29 is an illustration of the weight assignment step which assigns each cell a weight equal to the size of the neighborhood minus the index of the cell.

From FIG. 29, weight assignment step 601 assigns each cell a weight equal to the size of the neighborhood M minus the index of the cell i. Thus, for a neighborhood of size 20, the 20th cell has a weight of 0, while the first cell has a weight of 19.

An alternate preferred method of assigning weights is to declare a number L, where L equals M plus some positive integer, such as 2, and weights range from 21 down to 2. The reason for this shift is that the weight accorded to a factor of 1 is infinitely greater in terms of multiplications than a factor of zero. Thus relative weights may be misleading if low number factors, such as zero and one, are used as weighting factors. Any monotonically decreasing function may be employed in defining the weights accorded the cells within the neighborhood.

The system then calculates attraction weights in step 602. The total sum of the weights attracting the neighborhood to the region are defined as follows:

$$\text{SumWeight}_l(v) = \sum_{i;(X(w(v,i))<X_l(v))} \text{Weight}(w(v,i))$$

$$\text{SumWeight}_o(v) = \sum_{i;(X_l(v)\leq X(w(v,i))\leq X_r(v))} \text{Weight}(w(v,i))$$

$$\text{SumWeight}_r(v) = \sum_{i;(X(w(v,i))>X_r(v))} \text{Weight}(w(v,i))$$

Figure 30:
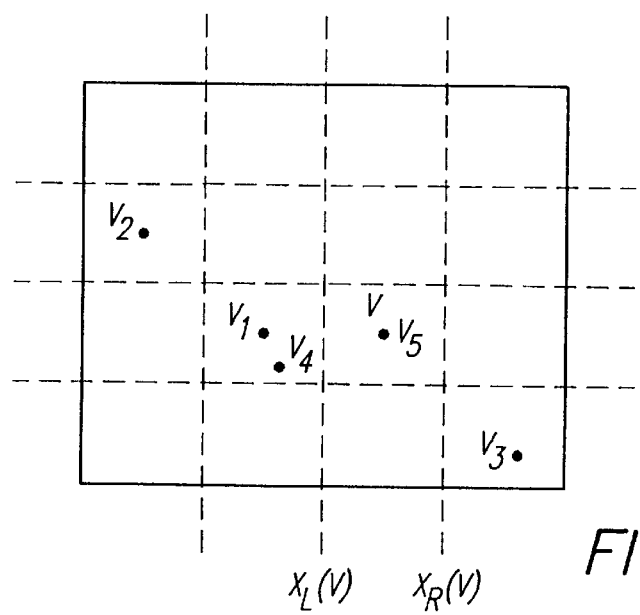
FIG. 30 is an illustration of the weights of the neighborhood attraction in a direction.

These equations represent the weights of the neighborhood attraction in a direction. For example, assume a neighborhood $(v_1, v_2, \ldots v_5)$, as shown in FIG. 30. The weights assigned to the individual cells in the neighborhoods represent the relative heights of the cells, but can be any measure of load accorded to the individual cell. The relative weights of the cells is (7, 6, 5, 4, 3). From the previous equations, the sum of weights to the left of the current region minimum line in the x direction, $x_L(v)$, is 7 plus 6 plus 4, or 17. The sum of weights to the right of the current region maximum line, $x_R(v)$, is 5. The sum of weights within the region bounded by the $x_L(v)$ and $x_R(V)$ lines is 3.

In affinity definition step 603, the system then defines the following neighborhood affinities for movement of cells in each particular direction:

$$Aff\text{Neighborhood}_x(v,0) = 0$$

$$Aff\text{Neighborhood}_x(v,-1) = \frac{2*\text{Grid}_Y}{\text{Grid}_X+\text{Grid}_Y} * \frac{1}{M^2} *$$

$$(\text{SumWeight}_l(v) - \text{SumWeight}_o(v) - \text{SumWeight}_r(v))$$

$$Aff\text{Neighborhood}_x(v,1) = \frac{2*\text{Grid}_Y}{\text{Grid}_X+\text{Grid}_Y} * \frac{1}{M^2} *$$

$$(\text{SumWeight}_r(v) - \text{SumWeight}_o(v) - \text{SumWeight}_l(v))$$

These values represent the relative overall benefit of moving the location of the neighborhood in a particular direction or leaving the neighborhood in its current position. $\text{Grid}_X$ and $\text{Grid}_Y$ are identical to the values outlined above in reference to the density driven capacity penalty system, and represent the number of grids, or lines of regions, in the X and Y directions. $\text{Grid}_X$ is equal to $2^{Lev_x}$ and $\text{Grid}_Y$ is equal to $2^{Lev_y}$, where $Lev_x$ and $Lev_y$ define the number of hierarchy levels. The number M represents the number of cells in the neighborhood.

Resuming with the example of FIG. 30, M is equal to five and we are in the fourth level of hierarchy. Thus, $Aff\text{Neighborhood}_X(v,0)$ equals 0, and $Aff\text{Neighborhood}_X(v,-1)$ equals $(2*2/(2+2))*1/5^2*(17-5-3)$, or 9/25. $Aff\text{Neighborhood}_X(v,1)$ equals $(2*2/(2+2))*1/5^2*(3-5-17)$, or −19/25. Hence the X affinities for this example are (9/25, 0, −19/25) for leftward, center, and rightward movement, respectively. The Y affinities for this example are (−17/25, 0, and −15/25). Selecting the highest affinities yields the result that the neighborhood should be moved to the left and remain in its current vertical position. Affinities for the X and Y directions are therefore combined in step 604 to yield a total neighborhood affinity for movement of the current neighborhood to another region within the nine regions adjacent a non-edge region.

Affinities may be combined while still within the scope of the current invention. Combinations of capacity affinities, wire length affinities, cut affinities, and neighborhood affinities present an enhanced system of determining the preferred direction of movement of a cell or net. Such an affinity combination may include combining the following affinities:

$$Aff(v,\Delta_i,\Delta_j) = Aff\text{Neighborhood}(v,\Delta_i,\Delta_j) + QEF(v)*AffCap(v,\Delta_i,\Delta_j)$$

As outlined above, QEF(v) represents the capacity penalty influence factor, which is a function of cell v relative height. Such a combination of affinities takes into account cell position as well as relative weight accorded to an individual neighborhood.

Section 12: Functional Sieve Optimization Technique

The combination of affinities introduces an element of randomization. A deterministic system for combining affinities which converges at a relatively rapid rate is desired to optimally utilize affinities. Such a system which iteratively optimizes cell placement using a combination of affinities is the functional sieve approach.

The functional sieve performs several calculated iterations of combining affinities and moving cells based on relative affinities and then computing cost functions for the new cell positions. The functional sieve utilizes the following basic formula:

$$Aff(v,\Delta_i,\Delta_j) = \mu_1 * Aff\text{Neighborhood}(v,\Delta_i,\Delta_j) + \mu_2 * AffHP(v,\Delta_i,\Delta_j) + QEF(v)*AffCap(v,\Delta_i,\Delta_j)$$

Figure 31:
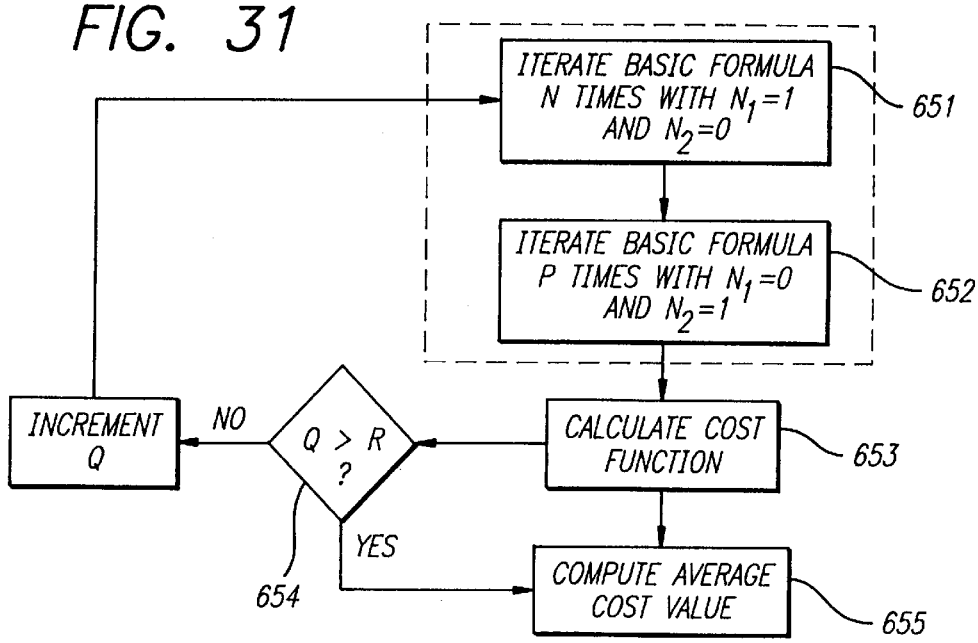
FIG. 31 is an illustration of the system which iterates a predetermined number of times, preferably once, calculating affinities.

As illustrated in FIG. 31, the system in step 651 iterates a predetermined number of times, preferably once, calculating the above affinities with $\mu_1$ equal to one and $\mu_2$ equal to zero. This iterative procedure produces affinities and cells which are then repositioned based on the combined neighborhood and capacity affinities. Subsequently, the system in step 652 performs a predetermined number of optimization iterations with $\mu_1$ equal to zero and $\mu_2$ equal to one, moving the cells based on cut and capacity affinities. The first iterative procedure involving neighborhood and capacity affinities combined with the second iterative procedure entailing cut and capacity affinities define a major iteration. After this major iteration, the system in step 653 calculates the value of the cost function. The preferred cost function is wire length.

After computing the cost function, the system performs a predetermined number of major iterations and calculates the cost function after each major iteration. The preferred number of major iterations and cost function calculations is six. After this predetermined number of major iterations and cost function value calculations, the system computes the average cost value for all of the costs calculated in the previous steps. This procedure steps through different affinity evaluations and obtains a preferred overall movement of cells on the surface abstraction. The functional sieve optimization process is halted when two consecutive cost average function values satisfy a given accuracy, such as $10^{-3}$ or $10^{-4}$.

During the discrete placement procedure described above, the $\mu_1$ parameter is utilized in a larger number of iterations than the $\mu_2$ parameter. Subsequently, the system performs several iterations with $\mu_1$ equal to zero. The entire block is iterated a predetermined number of times in this discrete placement procedure, typically three to five times.

During final placement, a crystallization procedure produces fine placement of the cells after the aforementioned functional sieve procedure is completed. The system uses a small nonzero value, such as $10^{-2}$, for $\mu_1$ a predetermined number of times, such as once, in the major iteration and the zero value several times. This procedure produces a detailed placement of cells.

An alternate embodiment of the current functional sieve alters the multiplying factors for the various affinities. Such an embodiment is particularly useful in crowded net situations, and emphasizes cross cuts while taking advantage of open nets.

The basic equation for the alternative embodiment is:

$$Aff(v, \Delta_i, \Delta_j) = \mu_1 * Aff\text{Neighbodhood}(v, \Delta_i, \Delta_j) + \mu_2 *$$

$$[(1 - \beta)*AffHP(v, \Delta_i, \Delta_j) + \beta*AffCut(v, \Delta_i, \Delta_j)] +$$

$$QEF(v) * AffCap(v, \Delta_i, \Delta_j)$$

where $\beta$ is a number between zero and one, depending on the emphasis desired placed on the number of cuts.

The affinity combinations disclosed within this functional sieve operation are not limited to those disclosed here, and may include other combinations using other weighting factors. Such an alternate weighting and affinity scheme would produce a desirable placement of cells and still within the scope of the present invention.

Section 13: Coarse Overflow Remover (Bulldozer)

A coarse overflow remover procedure is applied on the highest level of the chip core region hierarchy when each region contains a piece of only one column. The list of cells is scanned in the order of decreasing heights in order to find a new region for each of them. A list of cells in order of decreasing cell height is made. If the height of a cell is smaller than the available space in the corresponding column segment, then the cell retains its location. Most of the cells will keep their previous positions if the initial cell density is acceptable.

Figure 33:
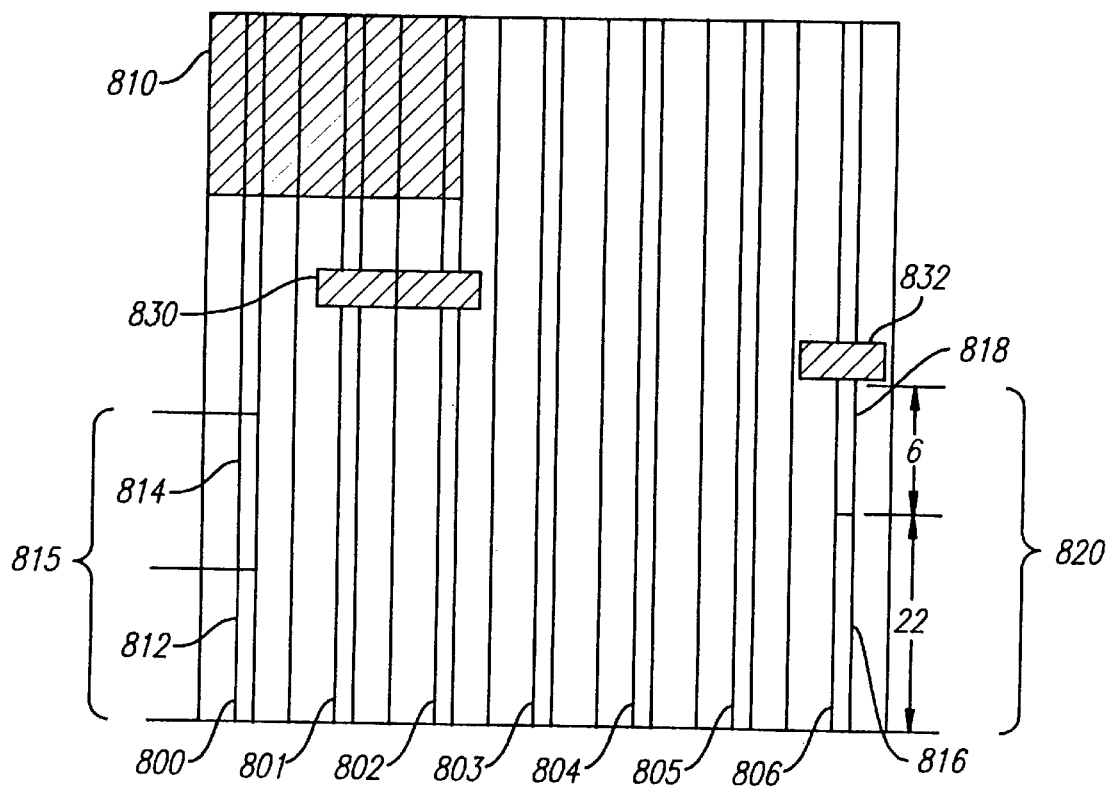
FIG. 33 is an illustration of a portion of the chip that has seven columns which are partitioned into maximal segments without blockages.

FIG. 33 represents a portion of the chip that has seven columns 800–806. As shown in FIG. 33, the cell columns 800–806 are partitioned into maximal segments without blockages. A plurality of megacells 810 may be located in the upper left corner. The megacells 810 are shown to extend across the columns 800–802. A first blockage 830 extends across the second and third columns 801 and 802, and a second blockage 832 extends across the column 806. Column 800 has two adjacent regions 812 and 814 that are assigned to a single column segment 815. Each of the column segments actually consists of a few regions, and each region belongs to exactly one of the segments. For each segment the total height of all cells assigned to the segment is retained. For example, The column 806 segment includes a region 816 that has a cell height of twenty-two and an adjacent region 818 that has a cell height of six. Therefore, the column segment 806 includes a column segment 820 that has a cell height of twenty-eight. This process is applied only to cells that have been already scanned, i.e. in the beginning of the process all those sums are equal to 0.

Figure 34:
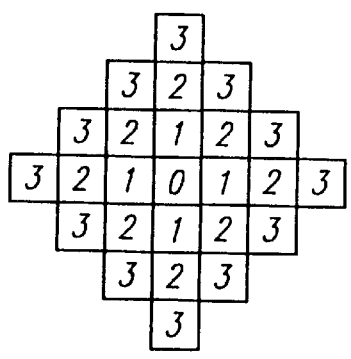
FIG. 34 is a preferred order for scanning the regions.

The capacity of a column segment is its height. The next cell from the list will get a new position according to the following rule: look for the closest (using Manhattan distance) region to the current cell so that the corresponding column segment will not have an overflow capacity if the next cell is assigned to that region. A preferred order for scanning the regions is shown in FIG. 34. First consider the original region (marked with the numeral 0) and then consider the regions having a distance of 1, then consider the regions having a distance of 2, etc.

This step considers only cells that already were assigned new positions and the current one. Usually, a cell is going to stay on the old position. As soon as the region is found that satisfies this condition, the region scanning is stopped, and assign the cell to that region. If the original region satisfies the condition, the cell is reassigned to the original region.

Section 14: Overlap Remover With Minimal Noise

Figure 35:
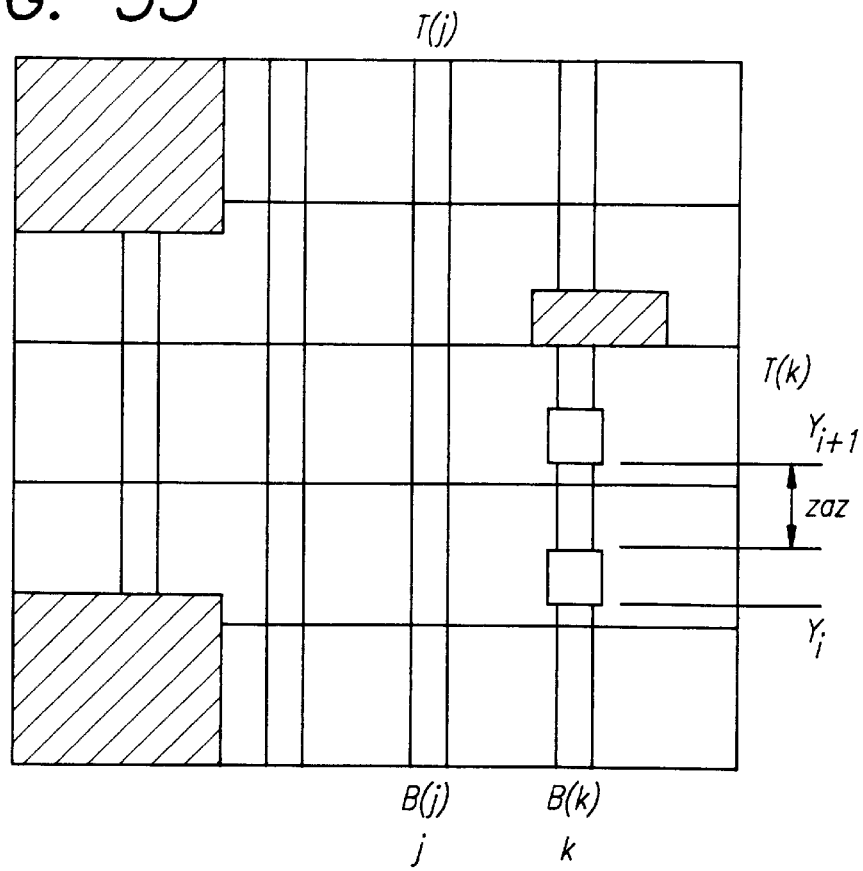
FIG. 35 is an illustration that denotes the top and bottom of the column.
Figure 36:
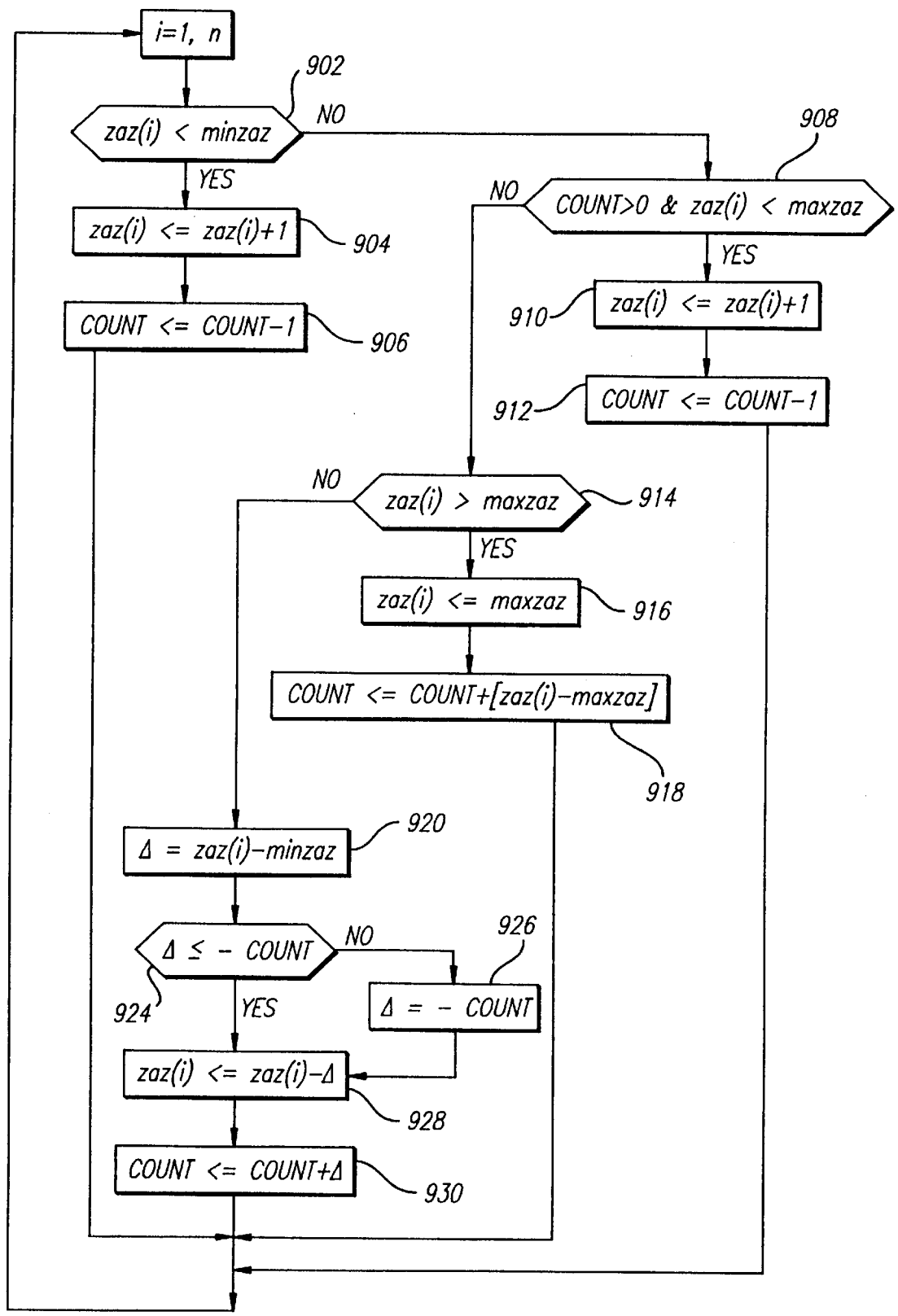
FIG. 36 is a flowchart of a preferred process adjusting cell spacing in the column to remove overlap with minimal noise.

The purpose of this process is to smoothly remove cell overlap with minimal increase of the wire length. FIG. 36 is a flow chart of an overlap remover according to the invention. The overlap remover process is applied separately to each column of cells. It is assumed that each column is continuously connected with no blockages between cells of the same column. As shown in FIG. 35, denote the top and bottom of the column with index j by T[j] and B[j], respectively. Similarly the top and bottom of column k are denoted by T[k] and B[k], respectively. The vertical grid step is used as the unit of measure.

First the cells in a column are sorted in the order of increasing cell bottom y coordinates. Denote cells in that order by $$v_1, v_2, \ldots v_n$$

The bottom coordinates of these cells are $$Y_1 \leq Y_2 \leq \ldots \leq Y_n$$

As shown in FIG. 35, the parameter zaz is defined as the distance between the top of one cell in a column and the bottom of the next cell upward. There must be at least one grid space between adjacent cells to have a feasible layout.

Figure 37:
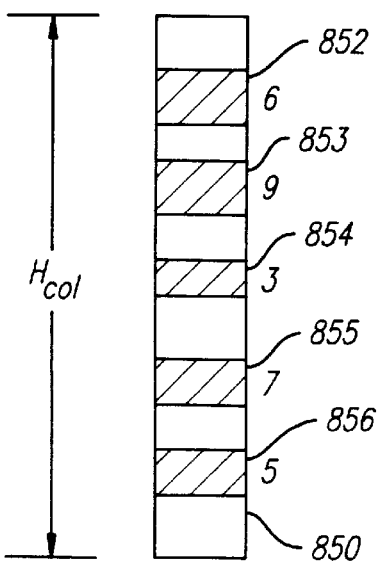
FIG. 37 illustrates a column containing cells of specified heights.

FIG. 37 illustrates a numerical example. Suppose a column 850 has a height $H_{col}$=60 and that the column 850 consists of five regions 852–856 that contain cells with heights of 5, 7, 3, 9 and 6, respectively. The total cell height is $$H_{cell} = \sum_{v \in \text{column}} \text{height}(v_i).$$

$$H_{cell} = 5 + 7 + 3 + 9 + 6 = 30$$

The average extra space per cell is now calculated as $$\frac{H_{col} - H_{cell}}{\text{total no. of cells} + 1} = \frac{60 - 30}{5 + 1} = 5.$$

The parameter minzaz satisfies the condition $$minzaz < \frac{H_{col} - H_{cell}}{\# \text{cells} + 1}.$$

Therefore, for the example given a possible value for minzaz is 3.

The following array is calculated:

$$zaz[0]=Y_1-B[j]; \ zaz[n]=T[j]-Y_n$$

$$zaz[i]=Y_{i+1}-Y_i-NormH[v_i]; \ i=1, 2, \ldots, n-1,$$

where Norms $[v_i]$ is the cell height in grids.

The parameter of the overlap remover process is integer values of minzaz, which can be positive or negative. The process further includes the step of modifying the array zaz such that all its elements are not less than minzaz. The array elements are processed forward and backward alternately. The following procedure is executed:

(a) At the beginning of the process the counter is initialized to zero. If the processing element is less than minzaz, then the element is increased by 1 and the counter is decreased by 1 and the next element is processed.

(b) If the element is greater than minzaz and also positive, but the counter is negative, then the counter is increased by 1 and the element is decreased by 1. The steps (a) and (b) are repeated until the condition is satisfied. Then we proceed with the next element.

(c) If all elements became not less than minzaz [zaz(i) $\geq$ minzaz) and the counter has zero value, the process is stopped. The cells are moved in one grid interval increments until the condition is satisfied.

FIG. 36 is a flowchart of a preferred process adjusting cell spacing in the column to remove overlap with minimal noise. The process of adjusting cell spacing begins with a step 900 where all movable cells from i=1 to i=n are to be considered. For each cell i, the spacing zaz(i) between the top of cell i and the bottom of cell i+1 is compared to minzaz in a process step 902. If zaz(i) is less than minzaz, then zaz(i) is replaced with zaz(i) plus one grid step (zaz(i)⇐zaz(i)+1) in a process step 904. A counter is then decremented by one in a process step 906. The foregoing steps 900, 902, 904 and 906 are repeated until zaz(i) is not less than minzaz.

If zaz(i) is not less than minzaz, then a process step 908 compares zaz(i) a parameter maxzaz, where maxzaz is the largest value of zaz(i) that will be permitted on the chip. If zaz(i) is less than maxzaz and the count is greater than 0, then zaz(i) is replaced by zaz(i) plus one grid step (zaz(i)⇐zaz(i)+1) in a process step 910. The counter is then decremented by one in a process step 912, and the foregoing steps 902, 908, 910 and 912 are repeated until the count becomes zero.

The remaining situation to be considered is when zaz(i) is not less than minzaz and the condition count >0 and zaz(i) <maxzaz is not satisfied. In a process step 914 zaz(i) is compared to maxzaz. If zaz(i) is greater than maxzaz, then zaz(i) is replaced by maxzaz in a step 916. The count then is incremented by the quantity [zaz(i)−maxzaz] in a step 918. The steps 902, 908, 914, 916 and 918 are repeated for the selected cell until the condition zaz(i)>maxzaz of step 914 is not satisfied.

The process of adjusting cell spacing then proceeds to a step 920 where a parameter $\Delta$ is defined such that $\Delta$=zaz(i) −minzaz. Then in a step 924 the parameter $\Delta$ is compared to the negative of the count to determine whether $\Delta \leq$−count. If $\Delta$ is not less than or equal to −count, then the parameter $\Delta$ is set equal to −count in a step 926; and the process proceeds to a step 928. If in the step 924, the parameter $\Delta$ is less than or equal to −count, then the process proceeds to the step 928 where zaz(i) is replaced with zaz(i)−$\Delta$. The count is then incremented by parameter $\Delta$ in a step 930, and the process of adjusting cell spacing is completed.

The result of adjusting the cell spacing in accordance with this preferred process is that overlap between cells is removed and spacing that were too large have been reduced to acceptable values. Cells that previously overlapped now have a spacing zaz(i) of one grid space. Cells that were too far apart now have spacings zaz(i) such that minzaz$\leq$zaz(i) $\leq$maxzaz.

After finishing the procedure the cell coordinates are modified:

$Y_1 = B[I] + zaz[0]$;

$Y_i = Y_{i-1} - NormH[v_i] + zaz[i-1]$,

For i=2, 3, . . ., n.

Section 15: Sinusoidal Optimization

This procedure significantly levelizes the cell density with almost no increase in wire length. The ColKey parameter has been discussed above in the section that describes the density-driven capacity penalty system. For the sinusoidal optimization procedure the ColKey parameter should be set to 1. Setting the ColKey parameter to 1 means that the height of a cell is distributed over all regions with which the cell overlaps. Precisely, if the cell has been assigned to the highest level hierarchy region with an index j, it is assumed that the cell center is in the center of the region. Depending on the real height of the cell, the occupancy is updated for all regions the cell with which the cell overlaps.

The region occupancy is updated after every cell move. Because the number of cells higher than the smallest region height is relatively small, updating the region occupancy is not going to affect the complexity of the optimization. In addition to the basic region capacity penalty, which is calculated taking into account real cell dimensions as described above, the segment column capacity penalty is also used now. It is necessary to consider the capacity penalty to achieve more uniform distribution of big cells on the chip.

The main block of the sinusoidal optimization procedure comprises a number of big iterations of the discrete placement optimization described previously herein with reference to FIGS. 21 and 22. Denote that main block by Optim (k), where k is the number of iterations. The main parameter is the capacity penalty influence parameter $\lambda$, which has been described previously with reference to FIGS. 23 and 24. The value of the capacity penalty influence parameter $\lambda$ will be changed during the sinusoidal optimization process.

Steps that preferably are included in the sinusoidal optimization procedure are as follows:

{
Optim(m);
$\lambda = \lambda \cdot 1$
Optim(2·m);
$\lambda = \lambda \cdot 1$
Optim(m)
$\lambda = \lambda/1$
Optim(2·m);
$\lambda = \lambda/1$
}.

where m and l are predetermined integer parameters. Typically m is one of the numbers 6 to 10, and $\lambda$ is 2. This sinusoidal optimization procedure typically is iterated in combination with the other levelizing procedures described herein, specifically, the dispersion-driven leveling system described in §16.

There are two types of sinusoidal optimization. One type is unconstrained and contains standard discrete placement optimization. The other type of sinusoidal optimization controls cell column densities inside the discrete placement optimization.

Section 16: Dispersion-Driven Levelizing System

Figure 32:
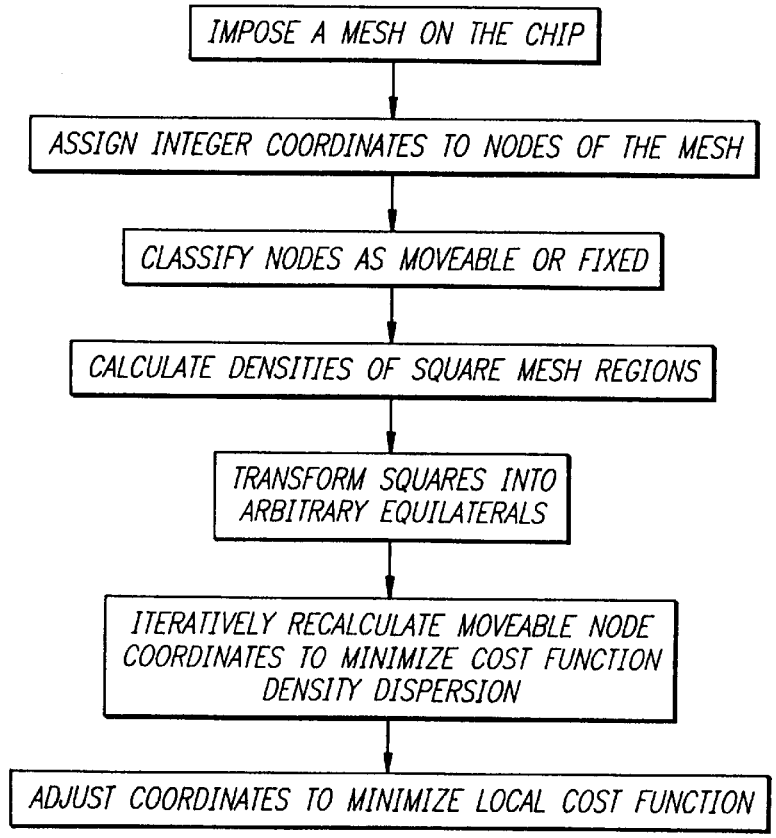
FIG. 32 is a flowchart associated with the density driven spring system.

This procedure does smooth continuous cell density levelization on the chip and is illustrated by FIG. 32. First, a new coordinate system is introduced on the chip by imposing a mesh on the chip and assigning integer coordinates to the nodes of the mesh. The nodes of the mesh are classified as to whether they are movable or fixed. Nodes of a square that overlaps with a blockage or a megacell are fixed. All other nodes are movable.

The densities of the square regions are calculated as a sum of portions of the height of the cells that overlap the region.

After coordinates are assigned to the nodes of the square mesh, the node coordinates are transformed such that the squares defined by the mesh are deformed into arbitrary equilaterals. A constraint on the deformation of the mesh is that regions that overlap with megacells are not deformed.

The coordinates of the movable nodes are iteratively recalculated to minimize the special cost function density dispersion. To speed up the convergence, the whole optimization procedure is organized hierarchically. Starting from the mesh square regions the hierarchy is built up using quadragrouping (reverse quadrasection).

On the hierarchy level k denote by den (k, i, j) the density of the region (k, i, j), and by s(k, i, j) the area of the region. The total density DEN will be the sum of the densities of the regions for all i and j.

$$DEN = \Sigma\Sigma den(k, i, j)$$

If the total available core area is a fixed number S, then define $$M = \frac{DEN}{S}$$

The density dispersion D is then given by $$D = \frac{1}{M}\sqrt{\Sigma\Sigma \frac{s(k,i,j)}{S} \cdot \left(\frac{den(k,i,j)}{s(k,i,j)} - M\right)^2}$$

which is the cost function. The dispersion is minimized by doing coordinate node local moves. Suppose the node is not on the core border and therefore has four adjacent regions. Then for each node A with coordinate (x, y) the local average density is computed as $$M(A) = \frac{\sum_{1}^{4} den_i}{\sum_{1}^{4} s_i(x,y)}$$

where $den_i$ are the densities of the four adjacent regions, and $s_i(x,y)$ are the areas of the images after deformation of the original regions assuming A has coordinates (x,y).

The local cost function is defined as $$\Sigma \frac{s_i(x,y)}{S} \left(\frac{den_i}{s_i(x,y)} - M(A)\right)^2$$

The coordinates for A are chosen in order to minimize the local cost function. An algorithm for minimizing the local cost is to separately move each point A(x,y) a distance $\delta$ to the left or right (up or down for the y coordinate). The value of $\delta$ can change with each coordinate. The value of the cost function is calculated for each move. In each local region the set of the coordinates that minimizes the cost function is chosen for the cells.

After all of the global levelization steps have been performed, there may still be some density "peaks" in the core region of the chip. The bulldozer procedure described above may be applied to remove these peaks. Finally, the sinusoidal optimization procedure is applied again to the chip surface, which is by now subdivided into cell columns. Reapplying the sinusoidal optimization process ensures that the cells will be evenly assigned to the columns as required by the structure of the final design.

Section 17: Cell Placement Crystallization

The purpose of this procedure is to get final cell placement. First, the height of each cell is increased by one grid plus $\gamma_1$ percent of the remaining available space. Then, the dispersion driven levelizing system and the sinusoidal optimization procedures are iterated $k_1$ times (e.g. 5 times).

Now, the original height of each cell is increased by one grid plus a certain percentage of the remaining available space. For this purpose, 72% is preferable. Then the overlap remover procedure is executed with maxzaz set equal to the column height to ensure that there is no overflow in any of the connected column segments.

Next the positions of the large cells are fixed and then the sinusoidal optimization is executed for $k_2$ iterations where $k_2$ may be 10 for example.

Now the detailed coordinates of each cell are obtained. In the remaining part of the placement crystallization the following three procedures are iterated:

1. The vertical optimization is performed for k3 iterations. During one iteration, the list of cells is scanned. For each cell the change in the cost function is calculated if the cell is moved down for a (parameter). The change in cost function is calculated if the cell is moved up. The move that improves the cost function the most (if any) is performed.

2. Overlap remover with minimal noise.

3. Next $k_4$ iterations of optimal permutations are performed. In this process the cost function is calculated if vertically adjacent cells are interchanged. Any such change that improves the cost function is performed. Referring to FIG. 1, if two cells $C_1$ and $C_2$ are interchanged, the space between them is maintained the same as before the interchange. The area occupied by these two cells is kept at a constant value.

Figure 38:
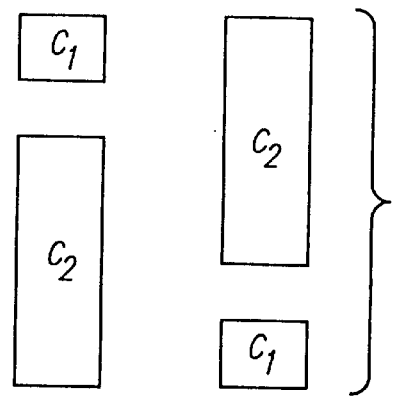
FIG. 38 is an illustration of the cells that are set to the grids by increasing the coordinate until the bottom of each cell reaches the closest horizontal grid line.

Finally, referring to FIG. 38, the cells are set to the grids by increasing the y-coordinate until the bottom of each cell reaches the closest horizontal grid line.

At this point, most of the cells are close to their final positions. The crystallization step places them in correct, final positions. Proper vertical cell spacings are computed, so that horizontal wires can be routed over and between cells in the vertical columns. Vertical and local-horizontal "swaps" may be performed if doing so improves the cost functions. Cells must be assigned proper geometric coordinates so that their positions correspond to legal grid positions specified by the underlying chip architecture. All of these steps are performed by the crystallization process described above, and the cells are frozen into their final positions. At this point, the placement process according to the invention system has completed its work. A data structure is prepared that can be read by a routing system (not shown) for chip routing and design completion.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

We claim:

1. A method for improving placement of a plurality of elements located on a surface divided by grid lines into regions, said surface having remaining available space, comprising the steps of:

(a) increasing a parameter associated with each element by one unit plus a first predetermined percentage of the remaining available space on said surface;

(b) performing various density balancing routines for a predetermined number of times;

(c) increasing the parameter associated with each element by one unit plus a second predetermined percentage of the remaining available space;

(d) performing a density levelizing procedure;

(e) securing elements having size greater than a predetermined amount;

(f) executing a predetermined number of sinusoidal optimizations;

(g) iteratively executing a series of a directional optimization routine, an overlap removal routine with minimal noise, and a series of an optimal permutation routine; and (h) Setting elements by increasing the position of the elements until each element reaches the closest grid line.

2. The method of claim 1 wherein said various density balancing routines comprise a dispersion driven levelizing procedure and a sinusoidal optimization procedure.

3. The method of claim 1, wherein said directional optimization routine comprises evaluating relative cost functions for moving the element a series of predetermined distances and selecting the movement which provides a greatest improvement in the cost function.

4. The method of claim 3, wherein said series of predetermined distances comprise no movement, movement in a positive direction for a predetermined distance, and movement in a negative direction a predetermined distance.

5. The method of claim 1, wherein said optimal permutations comprise switching adjacent elements to improve cost function.

6. The method of claim 5, wherein said switching of elements maintains the spacing between said two elements.

7. A method for optimizing placement of a plurality of elements on a surface divided into regions by a series of grid lines, said surface having remaining available space comprising:

(a) increasing a parameter associated with each element;

(b) performing various density balancing routines to said elements;

(c) locating elements having a parameter greater than a predetermined quantity and fixing positions of those elements; and (d) executing a plurality of optimal element movement routines.

8. The method of claim 7, wherein said increasing step comprises increasing a size parameter associated with each element by one unit plus a first predetermined percentage of the remaining available space on said surface.

9. The method of claim 8, further comprising a second size increasing step of increasing the size parameter associated with each element by one unit plus a second predetermined percentage of the remaining available space after said performing step.

10. The method of claim 9, further comprising the step of performing a density levelizing procedure after said second size increasing step.

11. The method of claim 7, wherein said density balancing routines comprise:

(a) a dispersion driven levelizing procedure;

(b) a sinusoidal optimization procedure;

(c) increasing the parameter associated with each element; and (d) performing a density levelizing procedure.

12. The method of claim 7, wherein said plurality of optimal element movement routines comprises:

(a) a predetermined number of sinusoidal optimizations; and (b) a series of a directional optimization routine, an overlap removal routine with minimal noise, and a series of an optimal permutation routines.

13. The method of claim 7, further comprising the step of setting elements by increasing the position of the elements until each element reaches the closest grid line.

14. The method of claim 7, wherein said density balancing routines comprise a dispersion driven levelizing procedure and a sinusoidal optimization procedure.

15. The method of claim 7, wherein said step of locating elements having a parameter greater than a predetermined quantity and fixing positions of those elements comprises evaluating relative cost functions for moving each element a series of predetermined distances and selecting the movement which provides a greatest improvement in the cost function.

16. The method of claim 15, wherein said series of predetermined distances comprise no movement, movement in a positive direction for a predetermined distance, and movement in a negative direction a predetermined distance.

17. The method of claim 12 wherein said optimal permutation routines comprise switching adjacent elements to improve cost function.

18. The method of claim 17, wherein said switching of elements maintains the spacing between said two elements.

19. A system for improving placement of a plurality of cells located on a semiconductor chip divided by regions by grid lines, said surface having remaining available space, comprising:

(a) means for increasing size associated with each cell by a fixed amount;

(b) means for performing various density equalization routines to all cells;

(c) means for locating cells having a size greater than a predetermined quantity and fixing those cells; and (d) means for executing a plurality of optimal cell movement routines.

20. The system of claim 19, where said means for increasing size comprises means for increasing the size of each cell by one unit plus a first predetermined percentage of the remaining available space on said surface.

21. The system of claim 19, further comprising means for increasing, for a second time, the size of each cell by one unit plus a second predetermined percentage of the remaining available space after application of said means for performing various density equalization routines.

22. The system of claim 21, further comprising means for performing a density levelizing procedure after application of said means for increasing, for a second time, the size of each cell.

23. The system of claim 19, wherein said density equalization routines comprise:

(a) means for a dispersion driven levelizing procedure;

(b) means for a sinusoidal optimization procedure;

(c) means for increasing the parameter associated with each cell; and (d) means for performing a density levelizing procedure.

24. The system of claim 19, wherein said plurality of optimal cell movement routines comprises:

(a) means for a predetermined number of sinusoidal optimizations; and (b) means for a series of a directional optimization routine, an overlap removal routine with minimal noise, and a series of an optimal permutation routines.

25. The system of claim 19, wherein said means (d) further comprises means for setting cells by increasing the position of the cells until each cell reaches the closest grid line.

26. The system of claim 19, wherein said density equalization routines comprise a dispersion driven levelizing procedure and a sinusoidal optimization procedure.

27. The system of claim 19, wherein said system further comprises means for evaluating relative cost functions for moving each cell a series of predetermined distances and selecting the movement which provides a greatest improvement in the cost function.

28. The system of claim 27, wherein said series of predetermined distances comprise no movement, movement in a positive direction for a predetermined distance, and movement in a negative direction a predetermined distance.

29. The system of claim 24, wherein said optimal permutation routines comprise switching adjacent elements to improve cost function.

30. The system of claim 29, wherein said switching of elements maintains the spacing between said two elements.

31. A computer readable medium having embodied thereon computer program code for causing a general purpose computer to optimally place cells on a semiconductor chip surface, said computer program code comprising the following:
   (a) computer code means for increasing a parameter associated with each of a plurality of elements;
   (b) computer code means for performing various density balancing routines to said elements;
   (c) computer code means for locating elements having a parameter greater than a predetermined quantity and fixing positions of those elements; and
   (d) computer code means for executing a plurality of optimal element movement routines.

* * * * *